(12) United States Patent
Stubbs et al.

(10) Patent No.: US 12,077,700 B2
(45) Date of Patent: Sep. 3, 2024

(54) TOP-EMITTING PRINTED DISPLAY WITH QUANTUM DOTS AND THERMALLY ACTIVATED DELAYED FLUORESCENCE MOLECULES

(71) Applicant: Kyulux, Inc., Fukuoka (JP)

(72) Inventors: Stuart Stubbs, Manchester (GB); Chris Brown, Natick, MA (US)

(73) Assignee: KYULUX, INC., Fukuoka (JP)

( * ) Notice: Subject to any disclaimer, the term of this patent is extended or adjusted under 35 U.S.C. 154(b) by 932 days.

(21) Appl. No.: 17/046,658

(22) PCT Filed: Apr. 4, 2019

(86) PCT No.: PCT/IB2019/000427
§ 371 (c)(1),
(2) Date: Oct. 9, 2020

(87) PCT Pub. No.: WO2019/197904
PCT Pub. Date: Oct. 17, 2019

(65) Prior Publication Data
US 2021/0155849 A1      May 27, 2021

Related U.S. Application Data

(60) Provisional application No. 62/656,075, filed on Apr. 11, 2018.

(51) Int. Cl.

| | | |
|---|---|---|
| C09K 11/02 | (2006.01) | |
| C09K 11/06 | (2006.01) | |
| C09K 11/08 | (2006.01) | |
| C09K 11/70 | (2006.01) | |
| H10K 50/11 | (2023.01) | |
| H10K 50/115 | (2023.01) | |
| H10K 50/15 | (2023.01) | |
| H10K 50/18 | (2023.01) | |
| H10K 85/60 | (2023.01) | |
| H10K 102/00 | (2023.01) | |
| H10K 50/818 | (2023.01) | |
| H10K 50/828 | (2023.01) | |
| H10K 50/852 | (2023.01) | |
| H10K 101/00 | (2023.01) | |
| H10K 101/10 | (2023.01) | |
| H10K 101/20 | (2023.01) | |

(52) U.S. Cl.
CPC .............. *C09K 11/70* (2013.01); *C09K 11/02* (2013.01); *C09K 11/06* (2013.01); *C09K 11/0883* (2013.01); *H10K 85/6572* (2023.02); *C09K 2211/1007* (2013.01); *C09K 2211/1018* (2013.01); *H10K 50/11* (2023.02); *H10K 50/115* (2023.02); *H10K 50/15* (2023.02); *H10K 50/18* (2023.02); *H10K 50/818* (2023.02); *H10K 50/828* (2023.02); *H10K 50/852* (2023.02); *H10K 2101/10* (2023.02); *H10K 2101/20* (2023.02); *H10K 2101/90* (2023.02); *H10K 2102/3026* (2023.02); *H10K 2102/351* (2023.02)

(58) Field of Classification Search
None
See application file for complete search history.

(56) References Cited

U.S. PATENT DOCUMENTS

| | | | | |
|---|---|---|---|---|
| 2016/0093813 A1 * | 3/2016 | Stoessel | ............. | H10K 85/6572 438/46 |
| 2019/0115555 A1 * | 4/2019 | He | .......................... | H10K 71/00 |
| 2021/0234113 A1 * | 7/2021 | Adachi | ................. | H10K 50/131 |

FOREIGN PATENT DOCUMENTS

| | | | | |
|---|---|---|---|---|
| CN | 106103648 A | 11/2016 | | |
| CN | 106229423 A | 12/2016 | | |
| CN | 106997889 A * | 8/2017 | .......... | H01L 27/3211 |
| JP | 2010-171205 A | 8/2010 | | |
| JP | 2017-509165 A | 3/2017 | | |
| TW | 201600583 A | 1/2016 | | |
| WO | 2015135625 A1 | 9/2015 | | |
| WO | 2017/140159 A1 | 8/2017 | | |
| WO | WO-2017179514 A1 * | 10/2017 | .......... | H01L 27/156 |
| WO | 2018001000 A1 | 1/2018 | | |
| WO | 2018047853 A1 | 3/2018 | | |
| WO | 2018/155642 A1 | 8/2018 | | |
| WO | 2019/197902 A1 | 10/2019 | | |

OTHER PUBLICATIONS

Machine translation of CN 106997889 A, retrieved Oct. 2023 (Year: 2023).*
Office Action dated Jun. 7, 2022 issued in the corresponding European patent application No. 19728513.3.
Office Action dated Mar. 24, 2023 issued in the corresponding European patent application No. 19728513.3.
Japanese office action dated Jan. 5, 2022, from corresponding JP patent application No. 2020-5553222.

(Continued)

*Primary Examiner* — Nicole M. Buie-Hatcher
(74) *Attorney, Agent, or Firm* — BROWDY AND NEIMARK, PLLC

(57) ABSTRACT

An emissive layer of a top-emitting (TE) printed display comprises a combination of solution-processable nanocrystal quantum dots, thermally activated delayed fluorescent molecules, and a suitable host material along with both electron and hole charge transport materials sandwiched into a microcavity between a reflective bottom electrode and a transparent or semi-transparent top electrode. The electrodes may be reflective metals and the thickness of the emissive layers and charge transport layers may be tuned according to the required resonant wavelength along with the thickness of the top semi-transparent electrode to optimize the resonant condition and maximize the light output.

10 Claims, 11 Drawing Sheets

(56) References Cited

OTHER PUBLICATIONS

Office Action dated Jul. 26, 2022, issued in corresponding Japanese application No. 2020-555322.
International Search Report issued in corresponding PCT application No. PCT/IB2019/000427 mailed Jul. 26, 2019, 14 pages.
Hiroki Uoyama et al: "Highly efficient organic light-emitting diodes from delayed fluorescence", Nature, vol. 492,Dec. 13, 2012 (Dec. 12, 2012), pp. 234-238; London ISSN: 0028-0836, DOI: 10.1038/nature11687.
Jan Ziegler et al: "Silica-Coated InP/ZnS Nanocrystals as Converter Material in White LEDs", Advanced Materials, Wiley-VCH Germany, DE, vol. 20, 2008, pp. 4068-4073, XP002637237, ISSN: 0935-9648, DOI: 10.1002/ADMA.200800724.
Hajime Nakanotani et al: "Promising operational stability of high-efficiency organic light-emitting diodes based on thermally activated delayed fluorescence", Scientific Reports, vol. 3, No. 2127, Jul. 3, 2013, pp. 1-6, DOI: 10.1038/srep02127.
International Preliminary Report on Patentability issued in corresponding PCT application No. PCT/IB2019/000427 mailed Oct. 13, 2020, 11 pages.
Chinese office action dated Apr. 26, 2023, from corresponding Chinese patent application No. 201980038516.6.
Office Action dated Oct. 7, 2022 issued in the corresponding Korean patent application No. 10-2020-7032559 with its English Machine Translation.
Office Action dated Oct. 6, 2021, issued in the corresponding European patent application No. 19728513.3.
Office Action dated Nov. 24, 2023 issued in the corresponding Chinese patent application No. 201980038516.6 with its English Machine Translation.
Rejection Decision dated May 12, 2024 issued in the corresponding Chinese Patent Application No. 201980038516.6 with its English Machine Translation.

\* cited by examiner

TOP-EMITTING PRINTED DISPLAY WITH QUANTUM DOTS AND THERMALLY ACTIVATED DELAYED FLUORESCENCE MOLECULES

CROSS-REFERENCE TO RELATED APPLICATIONS

This application is a national stage of International Patent Application No. PCT/IB2019/000427, filed Apr. 4, 2019, which claims the benefit of U.S. Provisional Application No. 62/656,075, filed Apr. 11, 2018, the contents of which are incorporated by reference herein in their entirely.

FEDERALLY SPONSORED RESEARCH OR DEVELOPMENT

Not Applicable

BACKGROUND OF THE INVENTION

1. Field of the Invention

The present invention generally relates to light-emitting devices. More particularly, it relates to electroluminescent light-emitting devices comprising semiconductor nanoparticles (or "quantum dots").

2. Description of the Related Art Including Information Disclosed Under 37 CFR 1.97 and 1.98

Fluorescence occurs when an orbital electron of a molecule, atom, or nanostructure, relaxes to its ground state by emitting a photon from an excited singlet state.

$S_0$ is called the ground state of the fluorophore (fluorescent molecule), and $S_1$ is its first (electronically) excited singlet state.

A molecule in $S_1$ may relax by various competing pathways. It may undergo non-radiative relaxation in which the excitation energy is dissipated as heat (vibrations) to the solvent. Excited organic molecules may also relax via conversion to a triplet state, which may subsequently relax via phosphorescence, or by a secondary non-radiative relaxation step.

Relaxation from $S_1$ may also occur through interaction with a second molecule through fluorescence quenching. Molecular oxygen ($O_2$) is an extremely efficient quencher of fluorescence because of its unusual triplet ground state.

In most cases, the emitted light has a longer wavelength, and therefore lower energy, than the absorbed radiation; this phenomenon is known as the Stokes shift. However, when the absorbed electromagnetic radiation is intense, it is possible for one electron to absorb two photons. This two-photon absorption may lead to the emission of radiation having a shorter wavelength than the absorbed radiation. The emitted radiation may also be of the same wavelength as the absorbed radiation—a phenomenon termed "resonance fluorescence."

Molecules that are excited through light absorption or via a different process (e.g. as the product of a reaction) may transfer energy to a second 'sensitized' molecule, which is converted to its excited state and may then fluoresce.

An organic light emitting diode (OLED) is a light-emitting diode (LED) in which a film comprising organic compounds is placed between two conductors. The film emits light in response to excitation, such as an electric current.

OLEDs are useful in displays, such as television screens, computer monitors, mobile phones, and tablets. A problem inherent in OLED displays is the limited lifetime of the organic compounds. OLEDs which emit blue light, in particular, degrade at a significantly increased rate as compared to green or red OLEDs.

OLED materials rely on the radiative decay of molecular excited states (excitons) generated by recombination of electrons and holes in a host transport material. The nature of excitation results in interactions between electrons and holes that split the excited states into bright singlets (with a total spin of 0) and dark triplets (with a total spin of 1). Since the recombination of electrons and holes affords a statistical mixture of four spin states (one singlet and three triplet sublevels), conventional OLEDs have a maximum theoretical efficiency of 25%.

To date, OLED material design has focused on harvesting the remaining energy from the normally dark triplets. Recent work to create efficient phosphors, which emit light from the normally dark triplet state, have resulted in green and red OLEDs. Other colors, such as blue, however, require higher-energy excited states which accelerate the degradation process of the OLED.

The fundamental limiting factor to the triplet-singlet transition rate is a value of the parameter $|H_{fi}/\Delta|^2$, where $H_{fi}$ is the coupling energy due to hyperfine or spin-orbit interactions, and $\Delta$ is the energetic splitting between singlet and triplet states. Traditional phosphorescent OLEDs rely on the mixing of singlet and triplet states due to spin-orbital (SO) interaction, increasing $H_{fi}$, and affording a lowest emissive state shared between a heavy metal atom and an organic ligand. This results in energy harvesting from all higher singlet and triplet states, followed by phosphorescence (relatively short-lived emission from the excited triplet). The shortened triplet lifetime reduces triplet exciton annihilation by charges and other excitons. Recent reports suggest that the limit to the performance of phosphorescent materials has been reached.

It has been discovered that thermally activated delayed fluorescence (TADF), which relies on minimization of $\Delta$ as opposed to maximization of $H_{fi}$, may transfer population between singlet levels and triplet sublevels in a relevant timescale, such as, for example, 1-100 μs. OLEDs incorporating TADF molecules may reach higher excitation states without rapid degradation. The devices described herein are capable of luminescing at higher energy excitation states than devices previously described.

OLEDs are typically composed of a layer of organic materials or compounds between two electrodes, an anode and a cathode. The organic molecules are electrically conductive as a result of delocalization of π electronics caused by conjugation over part or all of the molecule. When a voltage is applied, electrons from the highest occupied molecular orbital (HOMO) present at the anode flow into the lowest unoccupied molecular orbital (LUMO) of the organic molecules present at the cathode. Removal of electrons from the HOMO is also referred to as inserting electron holes into the HOMO. Electrostatic forces bring the electrons and the holes towards each other until they recombine and form an exciton (which is the bound state of the electron and the hole). As the excited state decays and the energy levels of the electrons relax, radiation having a frequency in the visible spectrum is emitted. The frequency of this radiation depends on the band gap of the material, which is the difference in energy between the HOMO and the LUMO.

Because electrons and holes are fermions with half integer spin, an exciton may either be in a singlet state or a triplet state depending on how the spins of the electron and hole have been combined. Statistically, three triplet excitons will be formed for each singlet exciton. Decay from triplet states is spin forbidden, which results in increases in the timescale of the transition and limits the internal efficiency of fluorescent devices.

Thermally activated delayed fluorescence (TADF) seeks to minimize energetic splitting between singlet and triplet states ($\Delta$). The reduction in exchange splitting from typical values of 0.4-0.7 eV to a gap of the order of the thermal energy (proportional to $k_B T$, where $k_B$ is the Boltzmann constant, and T is temperature) means that thermal agitation may transfer population between singlet levels and triplet sublevels in a relevant timescale even if the coupling between states is small.

TADF molecules consist of donor and acceptor moieties connected directly by a covalent bond or via a conjugated linker (or "bridge"), A "donor" moiety is likely to transfer electrons from its HOMO upon excitation to the "acceptor" moiety. An "acceptor" moiety is likely to accept the electrons from the "donor" moiety into its LUMO. The donor-acceptor nature of TADF molecules results in low-lying excited states with charge-transfer character that exhibit very low $\Delta$. Since thermal molecular motions may randomly vary the optical properties of donor-acceptor systems, a rigid three-dimensional arrangement of donor and acceptor moieties may be used to limit the non-radiative decay of the charge-transfer state by internal conversion during the lifetime of the excitation.

It is beneficial, therefore, to decrease energetic splitting between singlet and triplet states ($\Delta$), and to create a system with increased reversed intersystem crossing (RISC) capable of exploiting triplet excitons. Such a system may result in decreased emission lifetimes. Systems with these features may be capable of emitting blue light without being subject to the rapid degradation prevalent in blue OLEDs of the prior art.

White top-emitting organic light-emitting diodes (OLEDs) attract much attention, as they are optically independent of the substrate used. While monochrome top-emitting OLEDs may be easily designed to have high-emission efficiency, white light emission faces certain obstacles. The commonly used thin metal layers as top electrodes turn the device into a microresonator having detrimental narrow and angular-dependent emission characteristics.

The "bottom" or "top" distinction refers not to orientation of an OLED display, but to the direction that emitted light exits the device. OLED devices are classified as bottom-emitting devices if light emitted passes through the transparent or semi-transparent bottom electrode and substrate on which the panel was manufactured. Top-emitting devices are classified based on whether the light emitted from the OLED device exits through the lid that is added following fabrication of the device. Top-emitting OLEDs are better suited for active-matrix applications as they may be more easily integrated with a non-transparent transistor backplane. The TFT array attached to the bottom substrate on which active matrix OLEDs (AMOLEDs) are manufactured is typically non-transparent, resulting in considerable blockage of transmitted light if the device followed a bottom emitting scheme.

LCDs filter the light emitted from a display backlight, allowing only a small fraction of the light through. Thus, they cannot show true black. However, an inactive OLED dement does not produce light or consume power, allowing true blacks. Removing the backlight also makes OLEDs lighter because some substrates are not needed. When looking at top-emitting OLEDs, thickness also plays a role when talking about index match layers (IIMLs). Emission intensity is enhanced when the IML thickness is 1.3-2.5 nm. The refractive value and the matching of the optical IMLs property, including the device structure parameters, also enhance the emission intensity at these thicknesses.

Transparent OLEDs have only transparent components (substrate, cathode, and anode) and, when turned off, are up to 85 percent as transparent as their substrate. When a transparent OLED display is turned on, it allows light to pass in both directions. A transparent OLED display may be either active- or passive-matrix. This technology may be used for heads-up displays.

Top-emitting OLEDs have a substrate that is either opaque or reflective. They are best suited to active-matrix design.

OLEDs are an attractive technology for display and lighting devices due to their advantages in efficiency, brightness, flexibility, color quality and viewing angle. For displays, high efficiency, stability and color purity are desirable and much effort has gone into improving these aspects of OLEDs. Because the emission spectrum of organic compounds is typically very broad, color purity an area that has required particular attention.

Currently, two such approaches have been used in the commercialization of OLED displays. Firstly, white organic light-emitting diodes (WOLEDs) are used along with color filter technology to achieve the RGB for displays. This has a number of disadvantages, inasmuch as light not passed by the color filters is lost reducing the overall efficiency of the system. This also has the effect of requiring higher driving voltages to the WOLED in order to achieve the same brightness, impacting upon power efficiency and lifetime of the panel.

Secondly, the microcavity effect has been used in OLEDs to improve both the extraction efficiency and color saturation. This may often be achieved through the use of distributed Bragg reflectors (DBR), inserted between the indium tin oxide (ITO) layer and the substrate or in top-emitting structures by sandwiching the emission layers between a reflective bottom electrode and a transparent or semi-transparent top electrode. In both cases, the cavity length may be optimized to ensure that light reflected from the respective electrodes interferes constructively. The DBR and metal/dielectric approaches have been shown to give enhancement factors to the external quantum efficiency (EQE) and current efficiency of ~2×. However, due to the broad organic emission, a blue shift of the emission wavelength is observed with increasing viewing angle. The angular dependence on color for the metal/dielectric approach is smaller than for the DBR and, along with simpler processing, may be the preferred approach.

Despite the metal/dielectric advantage that obtains, the resonance condition on the individual layer thicknesses is so strong that highly optimized structures are required for each emission wavelength of red, green and blue. The very strict thickness requirements required in strong cavity top-emitting (TE) OLEDs preclude traditional printed OLED technology from achieving the efficiency and color performance of the evaporated examples. A solution that enables the thickness control requirements and achieves the color performance and efficiency requirements would therefore offer a significant advantage.

BRIEF SUMMARY OF THE INVENTION

An emissive layer of a top-emitting (TE) printed display comprises a combination of solution-processable nanocrystal quantum dots (QDs), thermally activated delayed fluorescent molecules, and a suitable host material along with both electron and hole charge transport materials sandwiched into a microcavity between a reflective bottom electrode and a transparent or semi-transparent top electrode. The electrodes may be reflective metals such as, for example, aluminum, silver, and/or gold and the thickness of the emissive layers and charge transport layers may be tuned according to the required resonant wavelength along with the thickness of the top semi-transparent electrode to optimize the resonant condition and maximize the light output.

BRIEF DESCRIPTION OF THE SEVERAL VIEWS OF THE DRAWING(S)

DETAILED DESCRIPTION OF THE INVENTION

An electroluminescent (EL) device according to the invention comprises quantum dots that are excited at least in part by energy transferred from associated thermally activated delayed fluorescence (TADF) molecules. Hereinafter, such a device is referred to as a QD-LED.

In traditional OLED device structures, the emissive layer comprises a fluorescent organic material dispersed in a host matrix. One specific type of fluorescent material is an organic molecule which exhibits thermally activated delayed fluorescence (TADF).

The emitting layer of the QD-LED may include a population of quantum dots and a population of TADF molecules dispersed in a host matrix. In other instances, the emitting layer of the QD-LED may include a population of quantum dots and a population of TADF molecules without the use of a host matrix. In some instances, the emitting layer of the QD-LED may include a population of quantum dots dispersed in a host matrix, while an adjacent layer may include a population of TADF molecules dispersed in a different host matrix. In other instances, the emitting layer of the QD-LED may include a population of quantum dots, while an adjacent layer may include a population of TADF molecules, with neither layer utilizing a host matrix.

Figure 1:
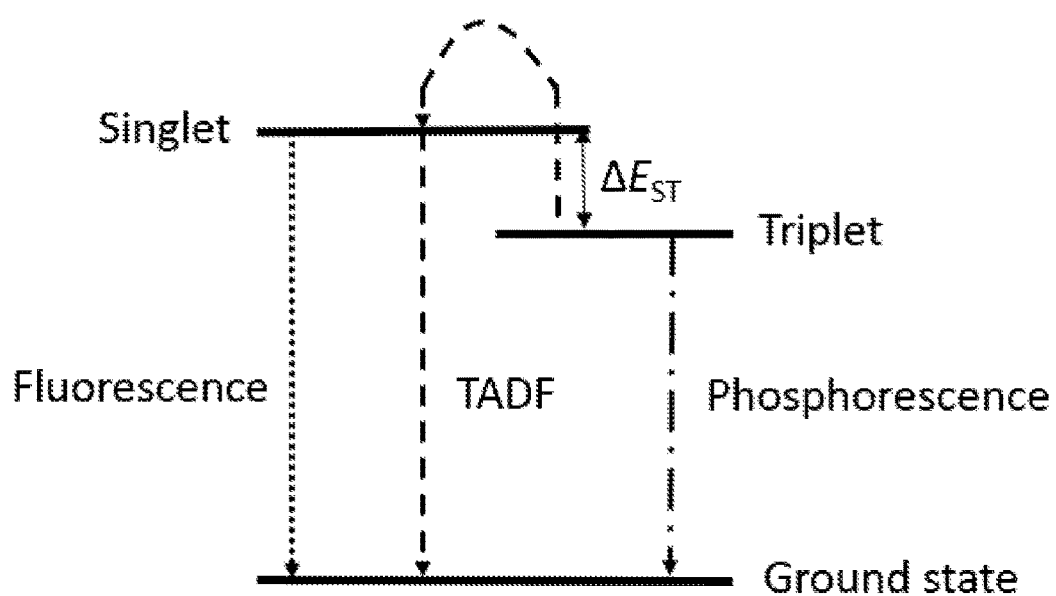
FIG. 1 depicts an energy level diagram of a TADF molecule.
Figure 2:
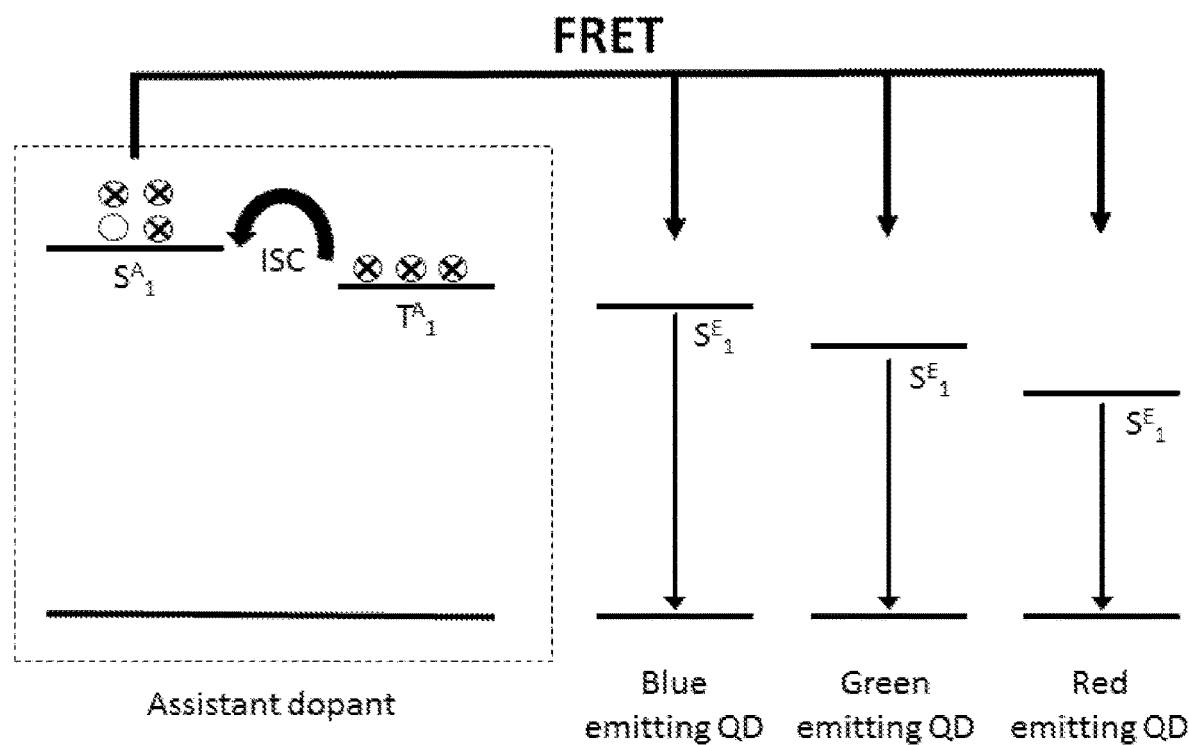
FIG. 2 depicts an energy level diagram of a two-dopant system in accordance with various aspects of the present disclosure.

FIG. 2 depicts an energy level diagram of a TADF molecule. In a TADF molecule, upon excitation, triplet state excitons are generated as previously discussed. Generally, triplet excitons generated from emitters such as platinum and iridium complexes non-radiatively decay from the triplet state to the ground state and do not contribute to light emission. In TADF molecules, on the other hand, the triplet excitons are upconverted to singlet state excitons via reverse intersystem crossing (RISC) due to the small energy gap ($\Delta E_{ST}$) between the singlet and triplet states, and light emission may be extracted as delayed fluorescence from the singlet state. In TADF molecules, $\Delta E_{ST}$ is provided by the absorption of thermal energy.

In accordance with various aspects of the present disclosure, a two-dopant system comprising a quantum dot fluorescent emitter dopant and a TADF-assistant dopant is provided for use in electroluminescent display devices such as QD-LED devices. QDs may provide advantages over organic fluorophores as fluorescent emitters for TADF-assisted light-emitting devices. Embodiments of the present disclosure are designed to combine the exciton harvesting capabilities of TADF molecules to achieve near unity internal quantum efficiency, with energy transfer of harvested excitons to QDs with high photoluminescence quantum yield, to achieve hyperfluorescent, narrow emission quantum dot devices. The narrow, pseudo-Gaussian emission of QDs may lead to better colour purity and efficiency as compared to organic fluorophores. QD fluorescence emission is tuneable by tuning the particle size and composition, whereas organic fluorophores generally exhibit broad and specific emission profiles. Additionally, the fluorescence quantum yields (QYs) of QDs are typically higher than those of organic fluorophores.

An emitting layer of a QD-LED device may include a population of quantum dots and a population of TADF molecules dispersed in a host matrix. In some instances, an emitting layer of a QD-LED device may include a population of quantum dots and a population of TADF molecules and be free of a host matrix. In either instance, emitting layers having both a population of quantum dots and a population of TADF molecules may have a thickness ranging from about 5 nm to about 100 nm. Additionally the emissive layer may have a QD:TADF ratio of about 10:1 to about 1:10 by weight.

In some instances, the emitting layer of a QD-LED may include a population of quantum dots dispersed in a host matrix, while an adjacent layer may include a population of TADF molecules dispersed in a different host matrix. In some instances, the emitting layer of a QD-LED may include a population of quantum dots free of a host matrix, while an adjacent layer may include a population of TADF molecules dispersed in a host matrix. The emitting layer, having QDs with or without a host matrix, may have a thickness ranging from about 2.5 nm to about 100 nm. The adjacent layer, having TADF molecules dispersed in a host matrix, may have a thickness ranging from about 10 nm to about 120 nm. In some instances, the TADF molecule-containing adjacent layer is a hole transport layer (HTL). In some instances, the TADF molecule-containing adjacent layer is a layer serving as both an electron blocking layer (EBL) and an HTL.

In some instances, TADF molecules are dispersed throughout the entirety of the adjacent layer. In other instances, TADF molecules are dispersed throughout only a portion of the adjacent layer. In other instances, TADF molecules are dispersed throughout only a portion of the adjacent layer, wherein the portion having TADF molecules is situated next to the emissive layer and the portion not having TADF molecules is situated away from the emissive layer.

The concentration (in wt % of the layer) of the TADF-molecules within the adjacent layer when the TADF molecules are dispersed throughout the entire adjacent layer, may range from about 1 wt % to about 50 wt %. When the TADF molecules are dispersed throughout only a portion adjacent layer, the concentration of the TADF-molecules within that portion may range from about 1 wt % to about 50 wt %.

Figure 3:
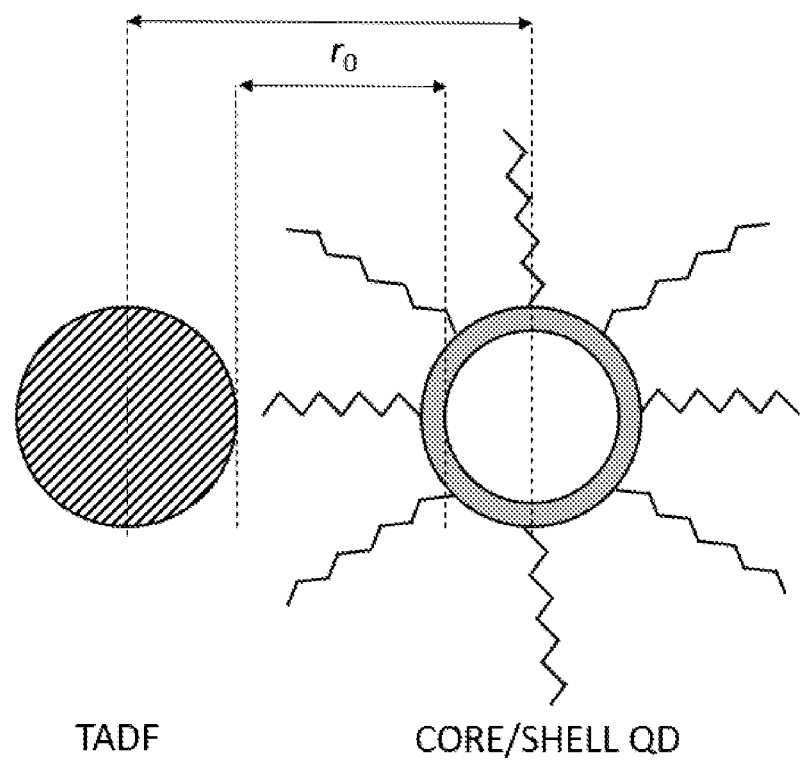
FIG. 3 is a schematic illustration of alternative bases for critical distance ($r_0$) determination in accordance with various aspects of the present disclosure.

FIG. 3 depicts an energy level diagram of a two-dopant system according to various aspects of the present disclosure. When an emissive layer includes only TADF compounds the triplet excitons are upconverted to singlet state excitons via reverse intersystem crossing (RISC) due to the small energy gap ($\Delta E_{ST}$) between the singlet and triplet states, and light emission may be extracted as delayed fluorescence from the singlet state as described above. When TADF molecules are in the presence of QDs, however, the singlet excitons of the TADF molecules are resonantly transferred to a singlet state of the QDs via Förster resonance energy transfer (FRET). Light is then emitted as delayed fluorescence from the singlet state of the QDs. This is true in instances where the TADF molecules and the QDs are in the same emissive layer and in instances where the QDs are in an emissive layer and the TADF molecules are in a layer adjacent to the emissive layer.

In some instances, the QDs may be blue-emitting QDs. In other instances, the QDs may be green-emitting QDs. In yet other instances, the QDs may be red-emitting QDs. In yet other instances, the QDs may be any combination of blue-, green- and red-emitting QDs. In yet other instances, the QDs may be UV-emitting QDs. In yet other instances, the QDs may be IR-emitting QDs. In yet other instances, the QDs may be tuned to emit at any wavelength ranging from the UV to the IR regions of the electromagnetic spectrum, depending on the application. The particular TADF molecule is not limiting. TADF molecules used in accordance with various aspects of the present disclosure may include, for example, those described in U.S. Pat. Nos. 9,502,668, 9,634,262, 9,660,198, 9,685,615, U.S. Patent Application Publication No. 2016/0372682, U.S. Patent Application Publication No. 2016/0380205, and U.S. Patent Application Publication No. 2017/0229658, the contents of which are hereby incorporated by reference in their entireties.

To optimize the performance of two-dopant systems in electroluminescent devices such as OLED devices, it may be advantageous to design QDs having various qualities. First, the QDs should have high oscillator strength. Second, the QDs should be fabricated to have high FRET with the TADF molecule. Third, the QDs should be fabricated to be strong absorbers. Finally, the QDs should be fabricated to exhibit a short excited state lifetime. The above are not necessarily the only qualities that may be optimized in systems according to the present disclosure.

Maximization of FRET

In accordance with various aspects of the present disclosure, singlet excitons of the TADF molecule are resonantly transferred to a singlet state of the QDs via FRET. A critical distance for the near-field dipole-dipole coupling mechanism, FRET, may be calculated from the spectral overlap of a TADF molecule (a "fluorescence donor") and a QD (an "absorbance acceptor") according to the well-known Förster mechanism [Förster, Th., Ann. Phys. 437, 55 (1948)]. To maximize the efficiency of FRET between the TADF molecule and the QD, the critical distance should be determined. The critical distance, $r_0$, between the TADF molecule and the QD is the distance at which the FRET efficiency is 50%, and is defined in Equation 1:

$$r_0^2 = \frac{9}{8\pi} \frac{c^4}{n^4} \kappa^2 \eta_D \int \frac{S_D(\omega)\sigma_A(\omega)}{\omega^4} d\omega$$

where c is the speed of light in a vacuum, n is the refractive index of the material, $\kappa^2$ is an orientation factor, $\eta_D$ is the photoluminescence (PL) quantum efficiency of the TADF molecule, $S_D$ is the normalised PL spectrum of the TADF molecule, and $\sigma_A$ is the QD absorption cross-section. [Y. Q. Zhang and X. A. Cao, Appl. Phys. Lett., 2010, 97, 253115]. The critical distance, $r_0$, may thus be manipulated by, for example, altering the PL properties of the TADF molecule (photo-luminescence maximum ($PL_{max}$)), full-width at half-maximum (FWHM) and PL quantum efficiency, and $\sigma_A$, which may be influenced by factors such as the shape, composition and architecture of the QDs. The better the spectral overlap between the TADF emission and the QD absorption, the better the transfer efficiency and thus the longer the distance over which the energy may be carried.

Figure 4:
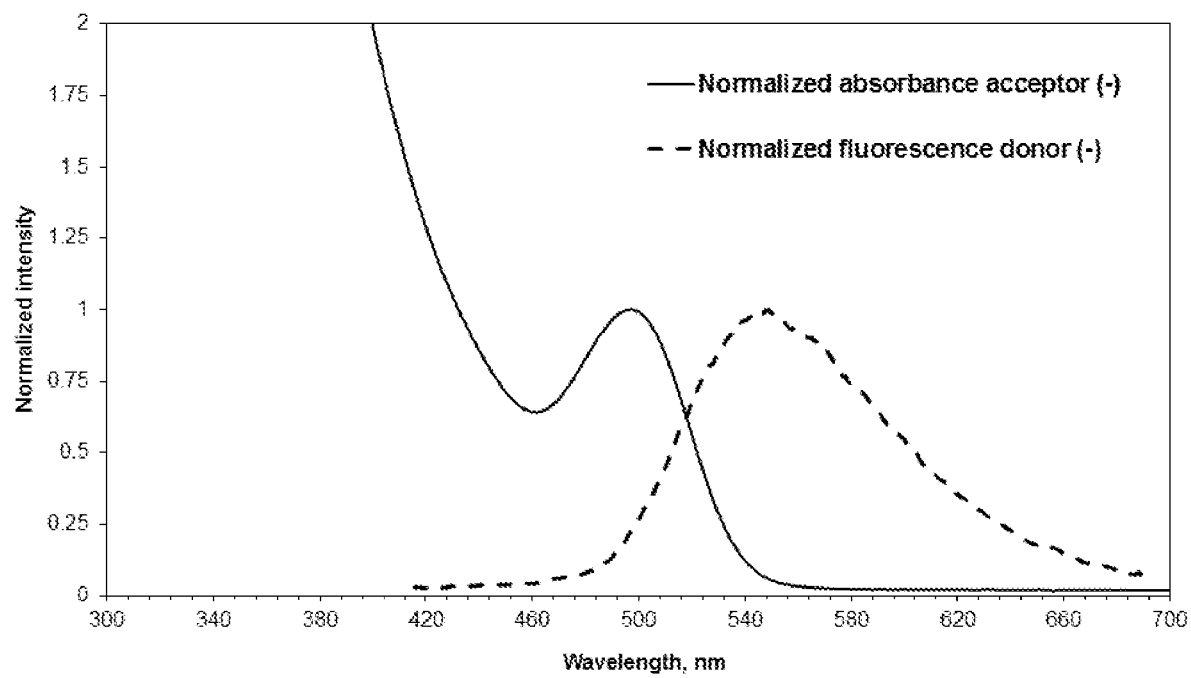
FIG. 4 is a graph illustrating the spectral overlap of the emission spectrum of an exemplary TADF molecule and the absorption spectrum of an exemplary QD in accordance with various aspects of the present disclosure.

FIG. 4 is a schematic illustration of alternative bases for $r_0$ determination. In some instances, $r_0$ may be measured from the centre of the TADF molecule to the centre of the QD core (from which emission takes place in a Type I QD). In other instances, $r_0$ may be measured from the edge of the TADF molecule to the edge of the QD core.

While the TADF molecule is shown in FIG. 4 as a circle or sphere, the shape of any particular TADF molecule is dependent upon its chemical structure. Additionally, while the QD is shown as being spherical, the shape of the QDs used in accordance with various aspects of the present disclosure may vary as described herein. QDs used in accordance with various aspects of the present disclosure may be any one of core, core-shell, core-multishell or quantum dot-quantum well (QD-QW) QDs. If $r_0$ is measured from the edge of the TADF molecule to the edge of the QD core, a QD-QW architecture may be desirable. A QD-QW comprises a narrower band gap first shell sandwiched between a core and a second shell of a wider band gap material, with emission coming from the first shell. Therefore, the distance between the edge of the TADF molecule and edge of the core in a core/shell QD may be greater than that between the edge of the TADF molecule and the edge of the first shell in a QD-QW.

In some instances, TADF molecules used in accordance with varying aspects of the present disclosure can be, for example,

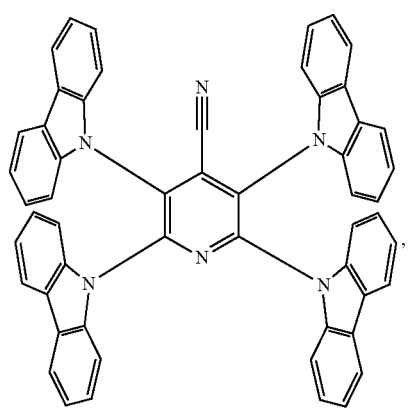

(2,3,5,6-tetra(9H-carbazol-9-yl)isonicotinonitrile)

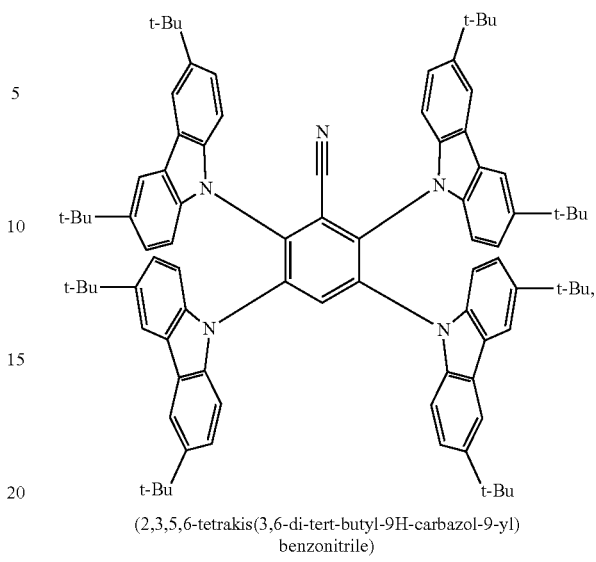

(2,3,5,6-tetrakis(3,6-di-tert-butyl-9H-carbazol-9-yl)benzonitrile)

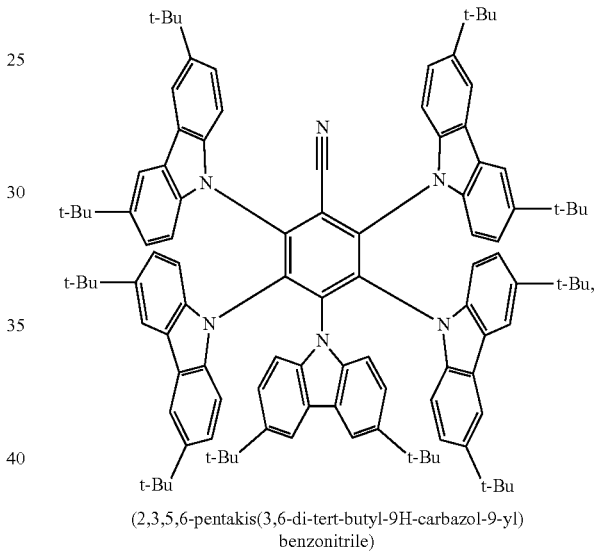

(2,3,5,6-pentakis(3,6-di-tert-butyl-9H-carbazol-9-yl)benzonitrile)

or any suitable structural analogs or homologs thereof.

In some instances, TADF molecules used in accordance with varying aspects of the present disclosure can be, for example,

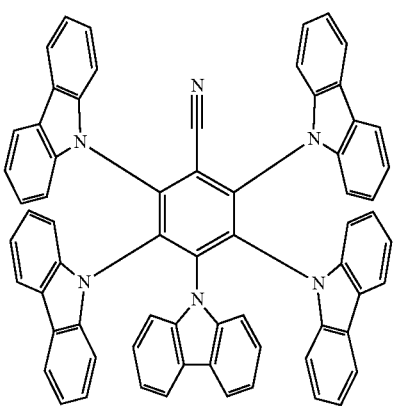

(2,3,5,6-tetra(9H-carbazol-9-yl)benzonitrile)

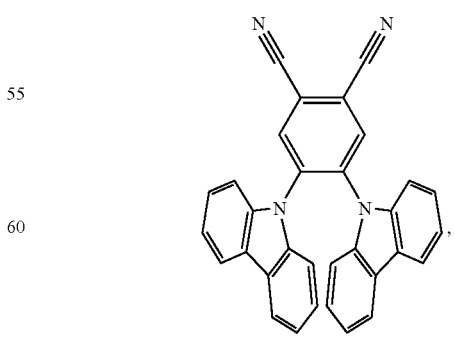

(4,5-di(9H-carbazol-9-yl)phthalonitrile)

(2,3,4,5,6-penta(9H-carbazol-9-yl)benzonitrile)

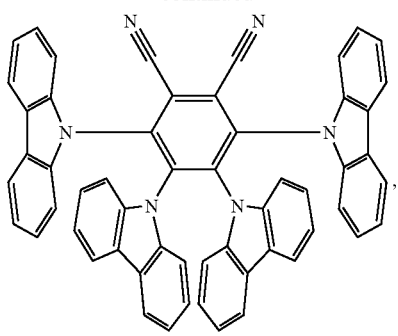

(3,4,5,6-tetra(9H-carbazol-9-yl)phthalonitrile)

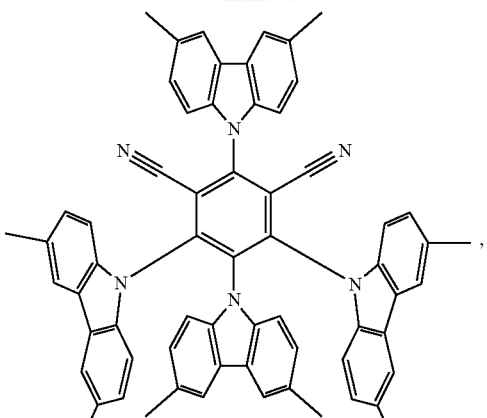

(2,3,4,5,6-tetrakis(3,6-dimethyl-9H-carbazol-9-yl)isophthalonitrile)

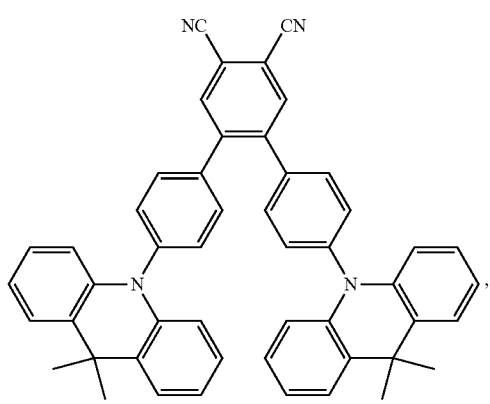

(4,4″-bis(9,9-dimethylacridin-10(9H)-yl)-[1,1′:2′,1″-terphenyl]-4′,5′-dicarbonitrile)

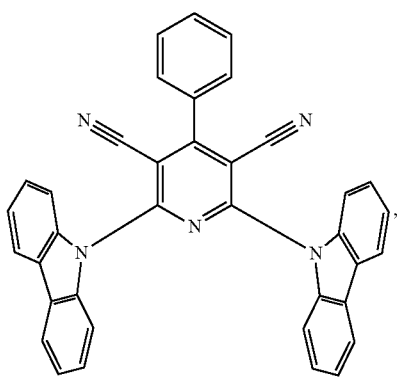

(2,6-di(9H-carbazol-9-yl)-4-phenylpyridine, 3,5-dicarbonitrile)

or any suitable structural analogs or homologs thereof.

In some instances, TADF molecules used in accordance with varying aspects of the present disclosure can be, for example, or any suitable structural analogs or homologs thereof.

In some instances, TADF molecules used in accordance with varying aspects of the present disclosure can be, for example,

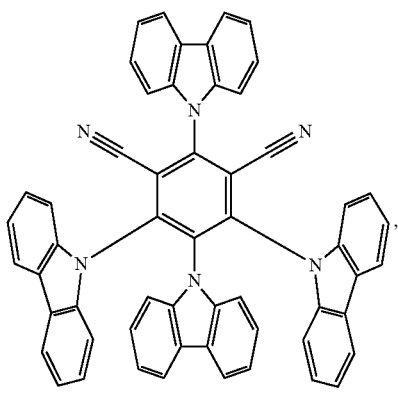

(2,3,4,5,6-tetra(9H-carbazol-9-yl)isophthalonitrile)

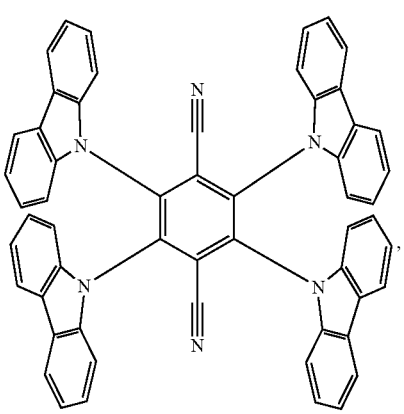

(2,3,5,6-tetra(9H-carbazol-9-yl)terephthalonitrile)

-continued

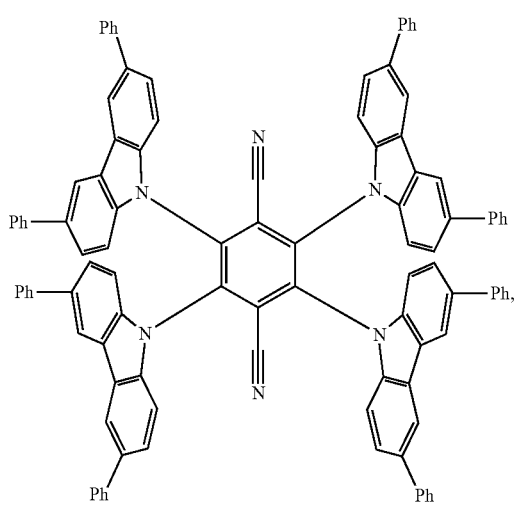

(2,3,5,6-tetrakis(3,6-diphenyl-9H-carbazol-9-yl)terephthalonitrile)

or any suitable structural analogs or homologs thereof.

In some instances, TADF molecules used in accordance with varying aspects of the present disclosure can be, for example,

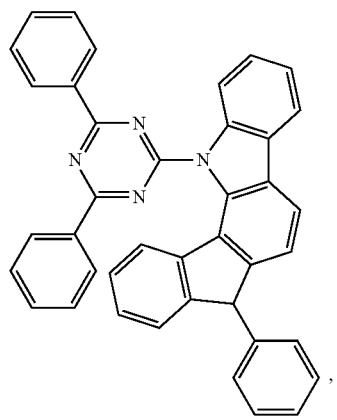

(12-(4,6-diphenyl-1,3-5-triazin-2-yl)-
5-phenyl-5,12-dihydroindolo[3,2a]
carbazole)

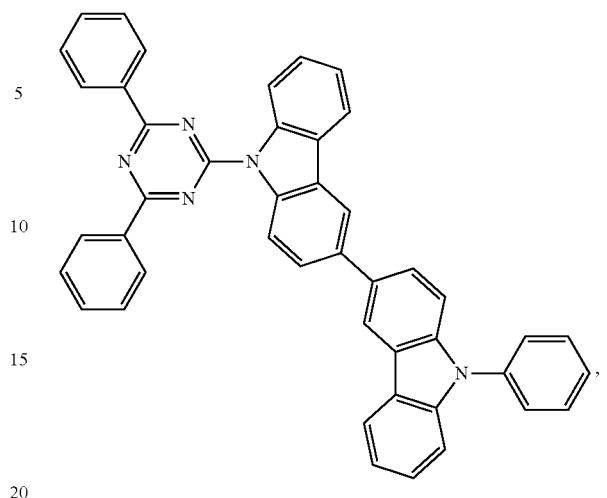

(9-(4,6-diphenyl-1,3,5-triazin-2-yl)-9′-phenyl-9H, 9′H, 3′-
bicarbazole)

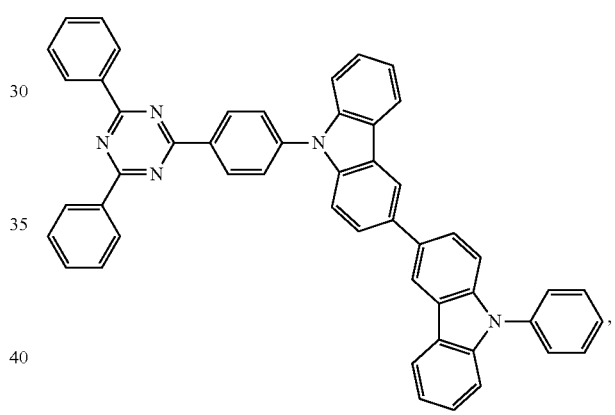

(9-(4-(4,6-diphenyl-1,3,5-triazin-2-yl)phenyl)-9′-phenyl-9H, 9′H-3,
3′-bicarbazole)

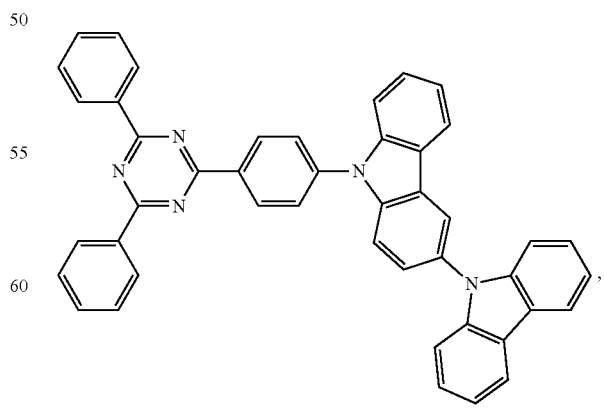

(9-(4-(4,6-diphenyl-1,3,5-triazin-2-yl)phenyl)-9H-3, 9′-bicarbazole

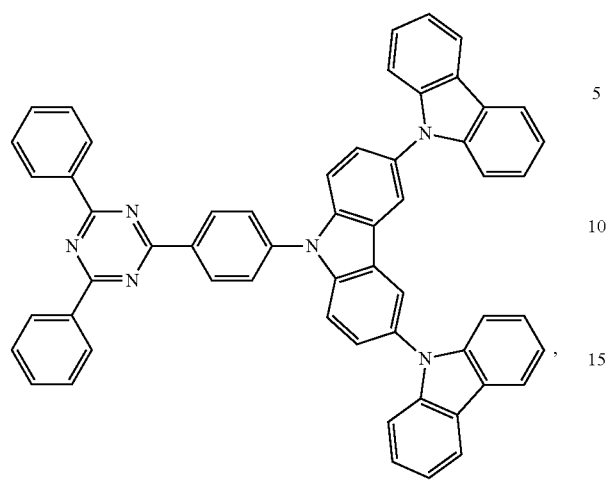

(9'-(4,(4,6-diphenyl-1,3,5-triazin-2-yl)phenyl)-9'H-9,3':6', 9"-tercarbazole)

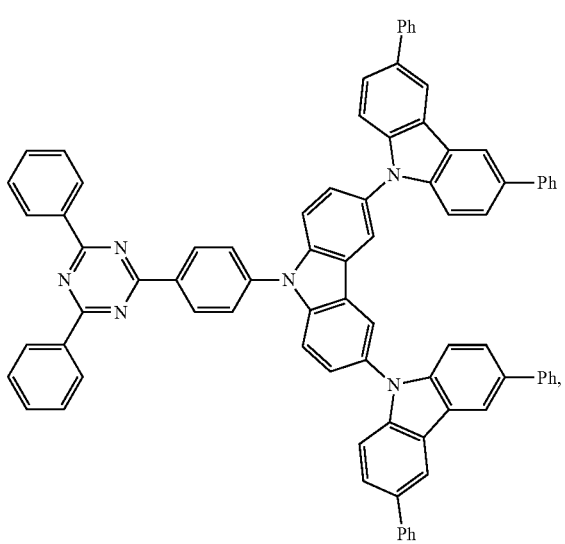

(9'-(4-(4,6-diphenyl-1,3,5-triazin-2-yl)phenyl)-3,3",6,6"-tetraphenyl-9'H-9,3':6',9"-tercarbazole)

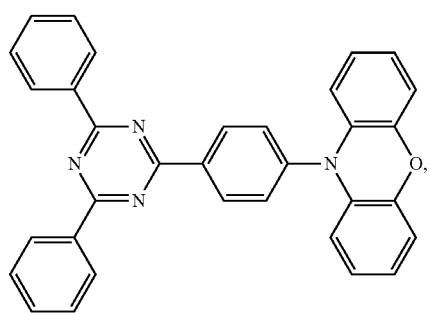

(10(4-(4,6-diphenyl-1,3,5-triazin-2-yl)phenyl-10H-phenoxazine)

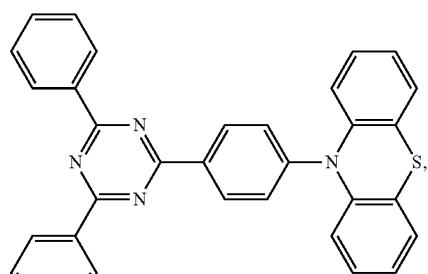

(10(4-(4,6-diphenyl-1,3,5-triazin-2-yl)phenyl-10H-phenothiazine)

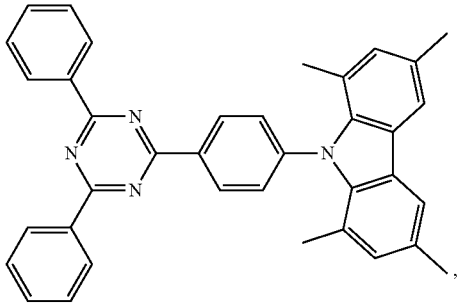

(9-(4-(4,6-diphenyl-1,3,5-triazin-2-yl)phenyl)-1,3,6,8-tetramethyl-9H-carbazole)

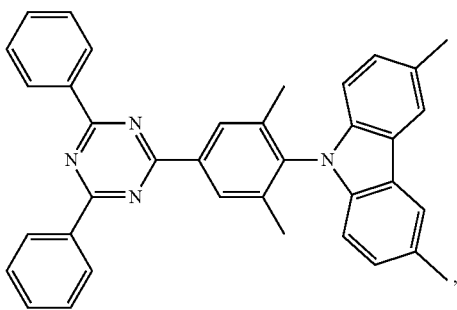

(9-(4-(4,6-diphenyl-1,3,5-triazin-2-yl)-2,6-dimethylphenyl)-3,6-dimethyl-9H-carbazole)

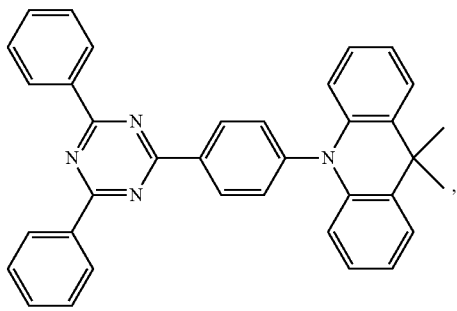

(10-(4-(4,6-diphenyl-1,3,5-triazin-2-yl)phenyl)-9,9-dimethyl-9, 10-dihydroacridine)

-continued

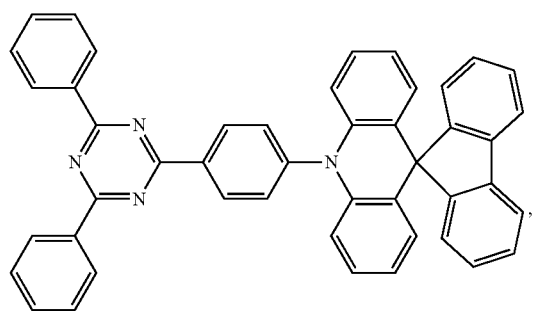

(10-(4-(4,6-diphenyl-1,3,5-triazin-2-yl)phenyl)-10H-spiro[acridine-9,9'-fluorene])

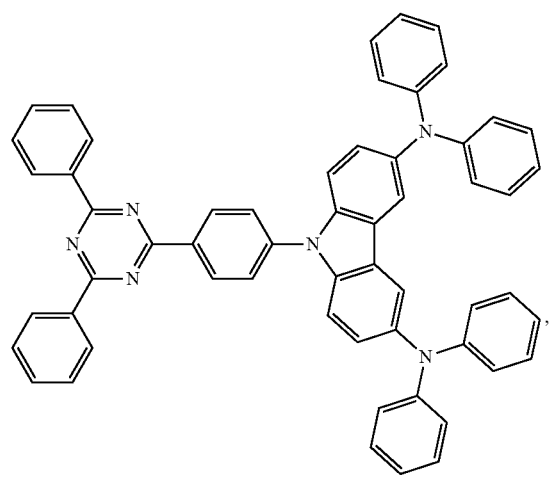

(9-(4-(4,6-diphenyl-1,3,5-triazin-2-yl)phenyl)-N3,N3,N6,N6-tetraphenyl-9H-carbazole-3,6-diamine)

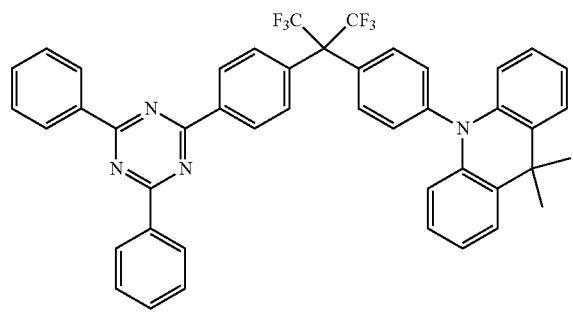

(10-(4-(2-(4-(4,6-diphenyl-1,3,5-triazin-2-yl)phenyl)-1,1,1,3,3,3-hexafluoropropan-2-yl)phenyl)-9,9-dimethyl-9,10-dihydroacridine)

or any suitable structural analogs or homologs thereof.

In some instances, TADF molecules used in accordance with varying aspects of the present disclosure can be, for example,

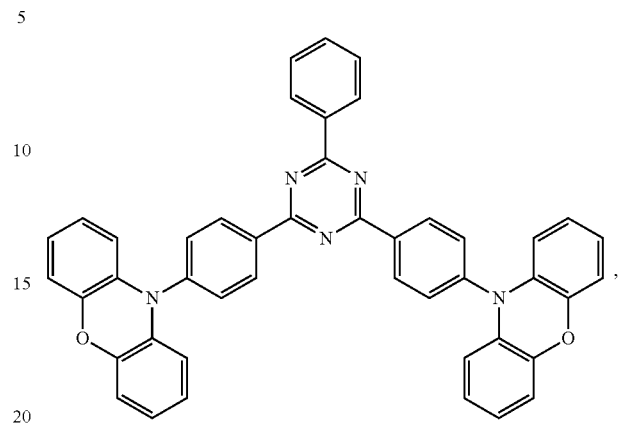

(10,10'-((6-phenyl-1,3,5-triazine-2,4-diyl)bis(4,1-phenylene))bis(10H-phenoxazine))

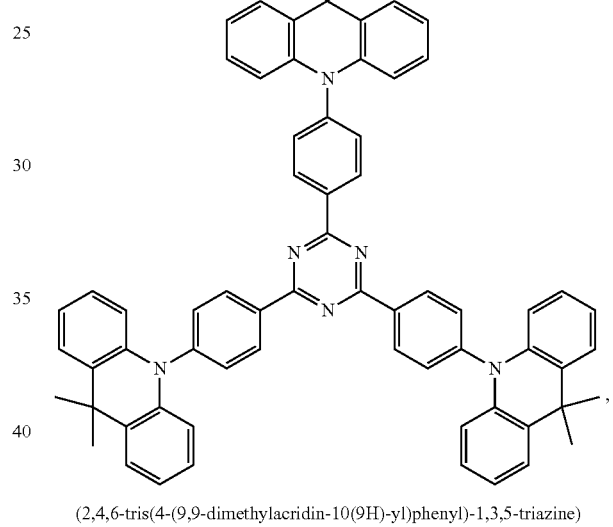

(2,4,6-tris(4-(9,9-dimethylacridin-10(9H)-yl)phenyl)-1,3,5-triazine)

(2,4,6-tris(4-(10H-phenoxazin-10-yl)phenyl)-1,3,5-triazine)

or any suitable structural analogs or homologs thereof.

In some instances, TADF molecules used in accordance with varying aspects of the present disclosure can be, for example,

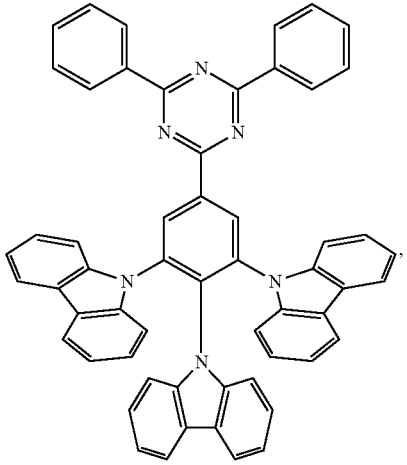

(9,9',9²-(5-(4,6-diphenyl-1,3,5-triazin-2-yl)
benzene-1,2,3-triyl)tris(9H-carbazole)

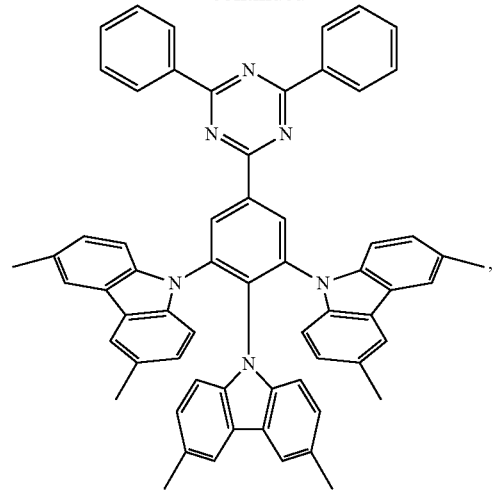

(9,9',9''-(5,(4,6-diphenyl-1,3,5-triazin-2-yl)benzene-
1,2,3-triyl)tris(3,6-dimethyl-9H-carbazole))

or any suitable structural analogs or homologs thereof.

In some instances, TADF molecules used in accordance with varying aspects of the present disclosure can be, for example,

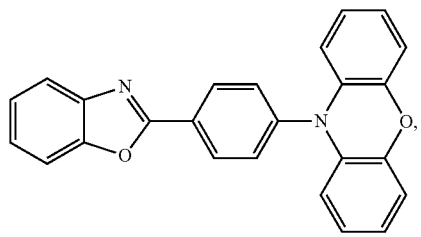

(10-(4-(benzo[d]oxazol-2-yl)phenyl)-10H-
phenoxazine)

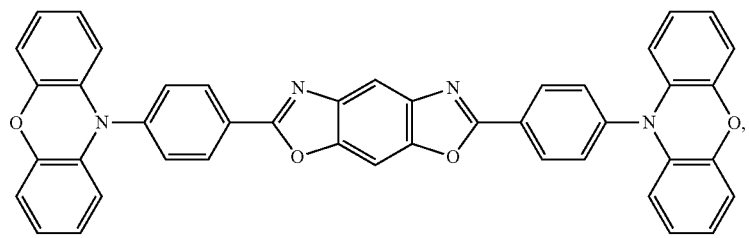

(2,6-bis(4-(10H-phenoxazin-10-yl)phenyl)benzo[1,2-d:5,4-d'']bis(oxazole))

or any suitable structural analogs or homologs thereof.

In some instances, TADF molecules used in accordance with varying aspects of the present disclosure can be, for example,

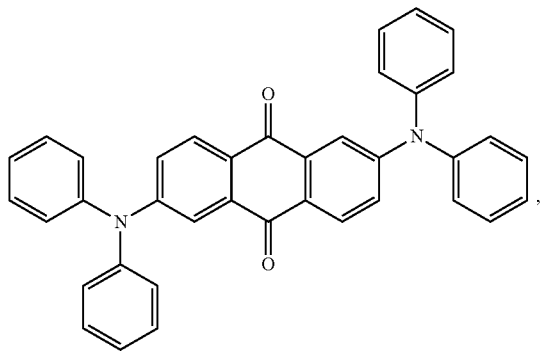

(2,6-bis(diphenylamino)anthracene-9,10-dione)

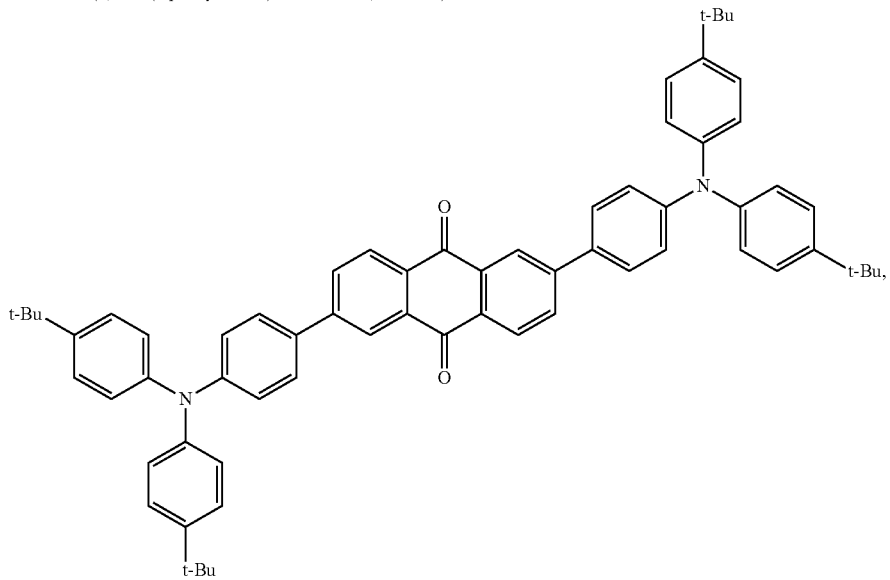

(2,6-bis(4-(bis(4-(tert-butyl)phenyl)amino)phenyl)anthracene-9,10-dione)

or any suitable structural analogs or homologs thereof.

In some instances, TADF molecules used in accordance with varying aspects of the present disclosure can be, for example,

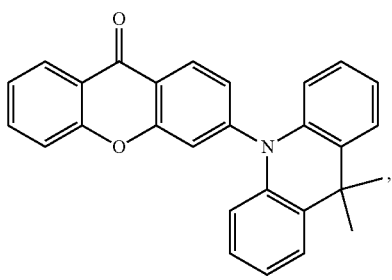

(3-(9,9-dimethylacridin-10(9H)-yl)-9H-xanthen-9-one)

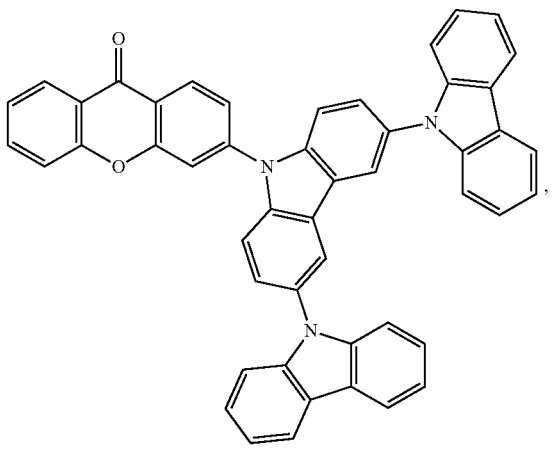

(3-(9'H-[9,3':6',9''-tercarbazol]-9'-yl)-9H-xanthen-9-one)

or any suitable structural analogs or homologs thereof.

In some instances, TADF molecules used in accordance with varying aspects of the present disclosure can be, for example,

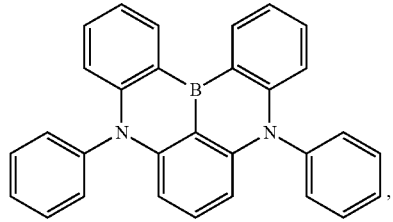

(5,9-diphenyl-5,9-dihydro-5,9-diaza-13b-borananphtho[3,2,1-de]anthracene)

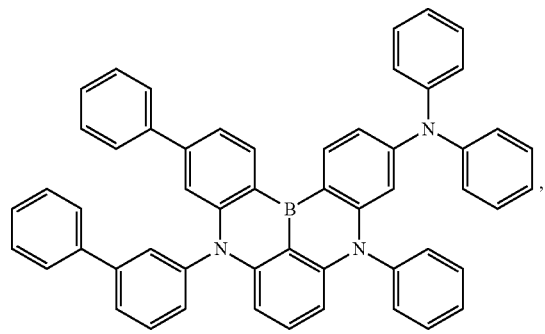

(9-([1,1'-biphenyl]-3-yl)-N, N, 5-11-tetraphenyl-5-9-dihydro-5, 9-diaza-13b-boranaphto[3,2,1-de]anthracen-3-amine)

or any suitable structural analogs or homologs thereof.

In some instances, TADF molecules used in accordance with varying aspects of the present disclosure can be, for example,

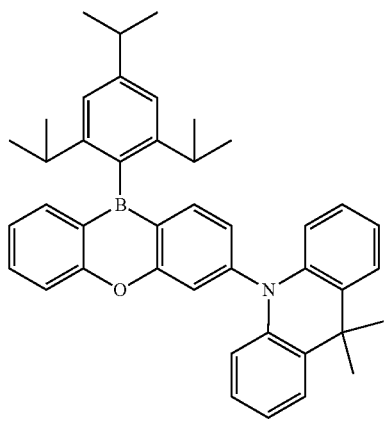

(9,9-dimethyl-10-(10-(2,4,6-triisopropylphenyl) -10H-dibenzo[b,e][1,4]oxaborinin-3-yl)-9,10-dihydroacridine)

or any suitable structural analog or homolog thereof.

In some instances, TADF molecules used in accordance with varying aspects of the present disclosure can be, for example,

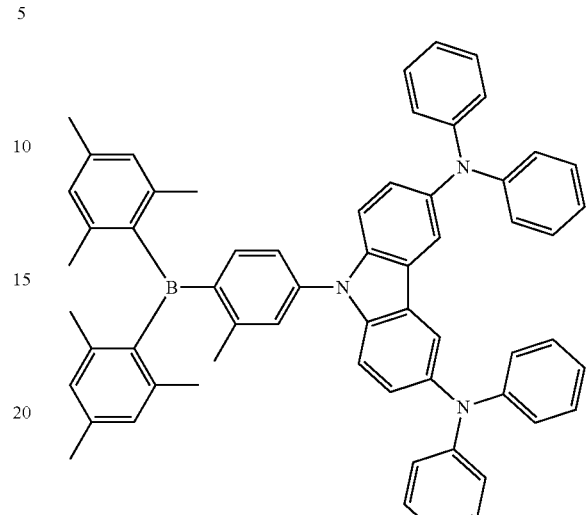

(9-(4(dimesitylboraneyl)-3,5-dimethylpheny)-N3, N3,N6,N6-tetraphenyl-9H-carbazole-3,6-diamine)

or any suitable structural analog or homolog thereof.

In some instances, TADF molecules used in accordance with varying aspects of the present disclosure can be, for example.

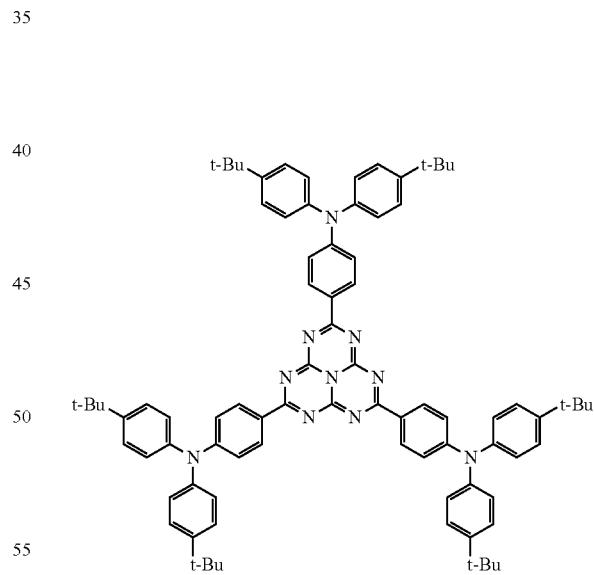

(4,4',4''-(1,3,3a1,4,6,7,9-heptaazaphenalene-2,5,8-triyl)tris(N,N-bis(4-(tert-butyl)phenyl)aniline))

or any suitable structural analog or homolog thereof.

In some instances, TADF molecules used in accordance with varying aspects of the present disclosure can be, for example,

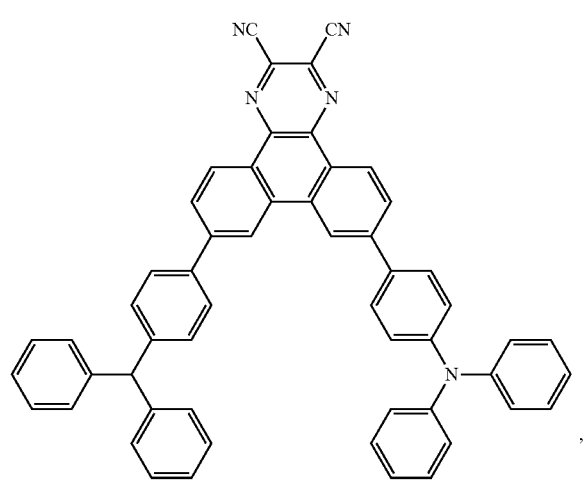

(7,10-bis(4-(diphenylamino)phenyl)dibenzo[f,h]quinoxaline-2,3-dicarbonitrile))

or any suitable structural analog or homolog thereof.

In some instances, TADF molecules used in accordance with varying aspects of the present disclosure can be, for example,

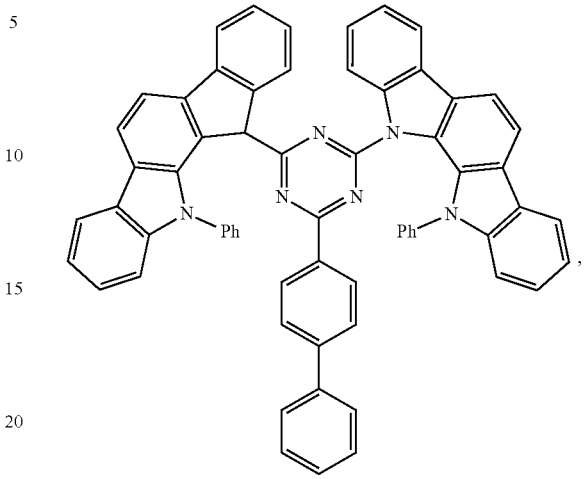

(12,12'-(6-([1,1'-biphenyl]-4-yl)-1,3,5-triazine-2,4-diyl)bis(11,12-dihydroindolo[2,3-a]carbazole))

or any suitable structural analog or homolog thereof.

In some instances, TADF molecules used in accordance with varying aspects of the present disclosure can be, for example,

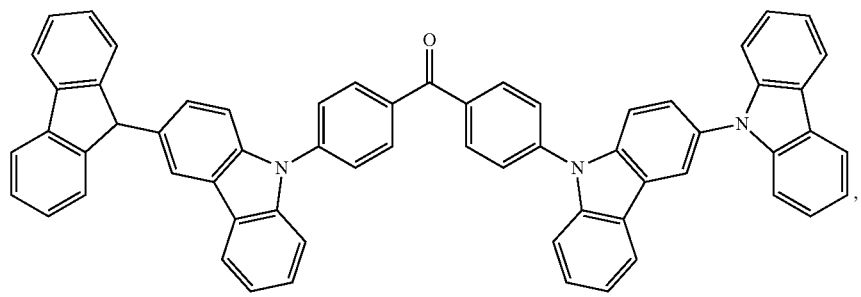

(bis(4-(9H-[3,9'-bicarbazol]-9-yl)phenyl)methanone)

or any suitable structural analog or homolog thereof.

In some instances, TADF molecules used in accordance with varying aspects of the present disclosure can be, for example,

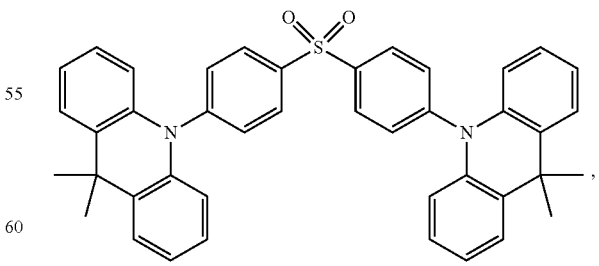

(10,10'-(sulfonylbis(4,1-phenylene))bis(9,9-dimethyl-9,10-dihydroacridine))

or any suitable structural analog or homolog thereof.

In some instances, TADF molecules used in accordance with varying aspects of the present disclosure can be, for example,

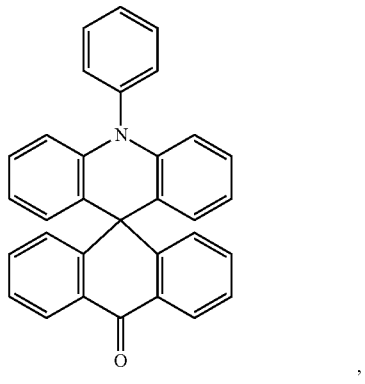

(10-phenyl-10H,10'H-spiro[acridine-9,9'-anthracen]-10'-one)

or any suitable structural analog or homolog thereof.

QDs used in accordance with varying aspects of the present disclosure can have a size ranging from 2-100 nm and include core material comprising:

IIA-VIA (2-16) material, consisting of a first element from group 2 of the periodic table and a second element from group 16 of the periodic table and also including ternary and quaternary materials and doped materials. Nanoparticle material includes but is not restricted to: MgS, MgSe, MgTe, CaS, CaSe, CaTe, SrS, SrSe, SrTe, BaS, BaSe, BaTe;

IIB-VIA (12-16) material consisting of a first element from group 12 of the periodic table and a second element from group 16 of the periodic table and also including ternary and quaternary materials and doped materials. Nanoparticle material includes but is not restricted to: ZnS, ZnSe, ZnTe, CdS, CdSe, CdTe, HgS, HgSe, HgTe;

II-V material, consisting of a first element from group 12 of the periodic table and a second element from group 15 of the periodic table and also including ternary and quaternary materials and doped materials. Nanoparticle material includes but is not restricted to: $Zn_3P_2$, $Zn_3As_2$, $Cd_3P_2$, $Cd_3As_2$, $Cd_3N_2$, $Zn_3N_2$;

III-V material, consisting of a first element from group 13 of the periodic table and a second element from group 15 of the periodic table and also including ternary and quaternary materials and doped materials. Nanoparticle material includes but is not restricted to: BP, AlP, AlAs, AlSb, GaN, GaP, GaAs, GaSb; InN, InP, InAs, InSb, AlN, BN;

III-IV material, consisting of a first element from group 13 of the periodic table and a second element from group 14 of the periodic table and also including ternary and quaternary materials and doped materials. Nanoparticle material includes but is not restricted to: $B_4C$, $Al_4C_3$, $Ga_4C$;

III-VI material, consisting of a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, GeTe; $In_2S_3$, $In_2Se_3$, $Ga_2Te_3$, $In_2Te_3$, InTe;

IV-VI material, consisting of a first element from group 14 of the periodic table and a second element from group 16 of the periodic table, and also including ternary and quaternary materials and doped materials. Nanoparticle material includes but is not restricted to: PbS, PbSe, PbTe, SnS, SnSe, SnTe;

V-VI material, consisting of a first element from group 15 of the periodic table and a second element from group 16 of the periodic table, and also including ternary and quaternary materials and doped materials. Nanoparticle material includes but is not restricted to: $Bi_2Te_3$, $Bi_2Se_3$, $Sb_2Se_3$, $Sb_2Te_3$; and Nanoparticle material, consisting of a first element from any group in the transition metal of the periodic table, and a second element from group 16 of the periodic table and also including ternary and quaternary materials and doped materials. Nanoparticle material includes but is not restricted to: NiS, CrS, $CuInS_2$, $CuInSe_2$, $CuGaS_2$, $CuGaSe_2$, $CuIn_xGa_{1-x}S_ySe_{2-y}$ (where $0 \leq x \leq 1$ and $0 \leq y \leq 2$), $AgInS_2$.

By the term doped nanoparticle for the purposes of specifications and claims, refers to nanoparticles of the above and a dopant comprised of one or more main group or rare earth elements, this most often is a transition metal or rare earth element, such as but not limited to zinc sulfide with manganese, such as ZnS nanoparticles doped with $Mn^+$.

The term "ternary material," for the purposes of specifications and claims, refers to QDs of the above but a three-component material. The three components are usually compositions of elements from the as mentioned groups Example being $(Zn_xCd_{1-x}S)_mL_n$ nanocrystal (where L is a capping agent).

The term "quaternary material," for the purposes of specifications and claims, refers to nanoparticles of the above but a four-component material. The four components are usually compositions of elements from the as mentioned groups Example being $(Zn_xCd_{1-x}S_ySe_{1-y})_mL_n$ nanocrystal (where L is a capping agent).

The material used on any shell or subsequent numbers of shells grown onto the core particle in most cases will be of a similar lattice type material to the core material i.e. have close lattice match to the core material so that it can be epitaxially grown on to the core, but is not necessarily restricted to materials of this compatibility. The material used on any shell or subsequent numbers of shells grown on to the core present in most cases will have a wider bandgap than the core material but is not necessarily restricted to materials of this compatibility. The materials of any shell or subsequent numbers of shells grown on to the core can include material comprising:

IIA-VIA (2-16) material, consisting of a first element from group 2 of the periodic table and a second element from group 16 of the periodic table and also including ternary and quaternary materials and doped materials. Nanoparticle material includes but is not restricted to: MgS, MgSe, MgTe, CaS, CaSe, CaTe, SrS, SrSe, SrTe;

IIB-VIA (12-16) material, consisting of a first element from group 12 of the periodic table and a second element from group 16 of the periodic table and also including ternary and quaternary materials and doped materials. Nanoparticle material includes but is not restricted to: ZnS, ZnSe, ZnTe, CdS, CdSe, CdTe, HgS, HgSe, HgTe;

II-V material, consisting of a first element from group 12 of the periodic table and a second element from group 15 of the periodic table and also including ternary and quaternary materials and doped materials. Nanoparticle material includes but is not restricted to: $Zn_3P_2$, $Zn_3As_2$, $Cd_3P_2$, $Cd_3As_2$, $Cd_3N_2$, $Zn_3N_2$;

III-V material, consisting of a first element from group 13 of the periodic table and a second element from group 15 of the periodic table and also including ternary and quaternary materials and doped materials. Nanoparticle material includes but is not restricted to: BP, AlP, AlAs, AlSb, GaN, GaP, GaAs, GaSb; InN, InP, InAs, InSb, AlN, BN;

III-IV material, consisting of a first element from group 13 of the periodic table and a second element from group 14 of the periodic table and also including ternary and quaternary materials and doped materials. Nanoparticle material includes but is not restricted to: $B_4C$, $Al_4C_3$, $Ga_4C$;

III-VI material, consisting of a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$;

IV-VI material, consisting of a first element from group 14 of the periodic table and a second element from group 16 of the periodic table and also including ternary and quaternary materials and doped materials. Nanoparticle material includes but is not restricted to: PbS, PbSe, PbTe, SnS, SnSe, SnTe;

V-VI material, consisting of a first element from group 15 of the periodic table and a second element from group 16 of the periodic table, and also including ternary and quaternary materials and doped materials. Nanoparticle material includes but is not restricted to: $Bi_2Te_3$, $Bi_2Se_3$, $Sb_2Se_3$, $Sb_2Te_3$; and Nanoparticle material, consisting of a first element from any group in the transition metal of the periodic table, and a second element from group 16 of the periodic table and also including ternary and quaternary materials and doped materials. Nanoparticle material includes but is not restricted to: NiS, CrS, $CuInS_2$, $CuInSe_2$, $CuGaS_2$, $CuGaSe_2$, $CuIn_xGa_{1-x}S_ySe_{2-y}$ (where $0 \leq x \leq 1$ and $0 \leq y \leq 2$), $AgInS_2$.

As illustrated in FIG. 4, the degree of separation or distance between the TADF molecule and a QD may be controlled by using QD capping ligands. Specifically, the longer the capping ligand, the greater the distance between the TADF molecule and the QD. Generally, a Lewis acid is used as a capping ligand. In some instances, capping ligands used in accordance with various aspects of the present disclosure may be primary, secondary or tertiary amines or ammonium compounds having one or more linear or branched $C_1$-$C_{24}$ alkyl groups; or one or more $C_3$-$C_{18}$ aromatic, polycyclic aromatic, cycloalkane, cycloalkene, cycloalkyne, polycycloalkane, polycycloalkene, or polycycloalkyne groups. In some instances, capping ligands used in accordance with various aspects of the present disclosure may be primary, secondary or tertiary phosphines or phosphonium compounds having one or more linear or branched $C_1$-$C_{24}$ alkyl groups; or one or more $C_3$-$C_{18}$ aromatic, polycyclic aromatic, cycloalkane, cycloalkene, cycloalkyne, polycycloalkane, polycycloalkene, or polycycloalkyne groups. In some instances, capping ligands used in accordance with various aspects of the present disclosure may be a carboxylic acid having a linear or branched $C_1$-$C_{24}$ alkyl group; or a $C_3$-$C_{18}$ aromatic, polycyclic aromatic, cycloalkane, cycloalkene, cycloalkyne, polycycloalkane, polycycloalkene, or polycycloalkyne groups. In some instances, capping ligands used in accordance with various aspects of the present disclosure may be an alcohol, polyol, a thiol, a selenol or a tellurium equivalent (R—Te—H) having a linear or branched $C_1$-$C_{24}$ alkyl group; or a $C_3$-$C_{18}$ aromatic, polycyclic aromatic, cycloalkane, cycloalkene, cycloalkyne, polycycloalkane, polycycloalkene, or polycycloalkyne groups. In some instances, capping ligands used in accordance with various aspects of the present disclosure may be an entropic ligand. As used herein, "entropic ligand" refers to a ligand having an irregularly branched alkyl chain. Examples of suitable entropic ligands include, but are not restricted to: irregularly branched thiols, for example, 2-methylbutanethiol, and 2-ethylhexanethiol; and irregularly branched alkanoic acids, for example, 4-methyloctanoic acid, 4-ethyloctanoic acid, 2-butyloctanoic acid, 2-heptyldecanoic acid, and 2-hexyldecanoic acid. Entropic ligands may improve nanoparticle processability, while retaining or improving their performance in devices.

To maximise FRET, smaller QDs emitting at a given wavelength may be desirable. For example, QDs based on InP, which has a narrower bulk band gap and larger Bohr radius than core QDs such as CdSe, may be advantageous. An InP QD core emitting at, for example, 620 nm, will typically have a smaller diameter than a CdSe QD core emitting at the same wavelength.

Figure 5:
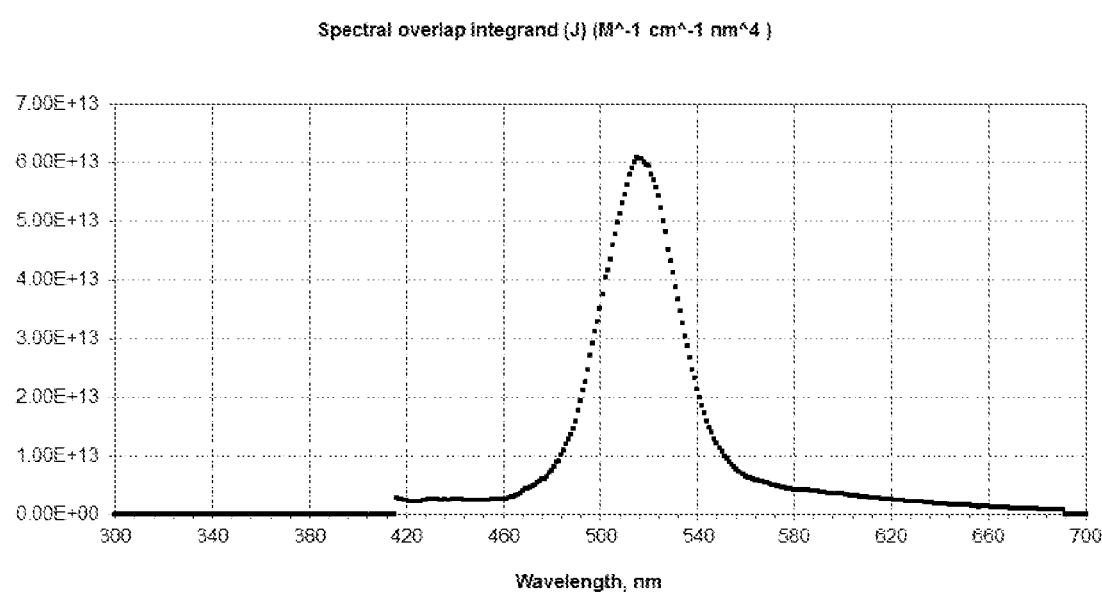
FIG. 5 is a graph illustrating the integrated spectral overlap of the emission spectrum of the exemplary TADF molecule and the absorption spectrum of the exemplary QD of FIG. 4 in accordance with various aspects of the present disclosure.
Figure 6:
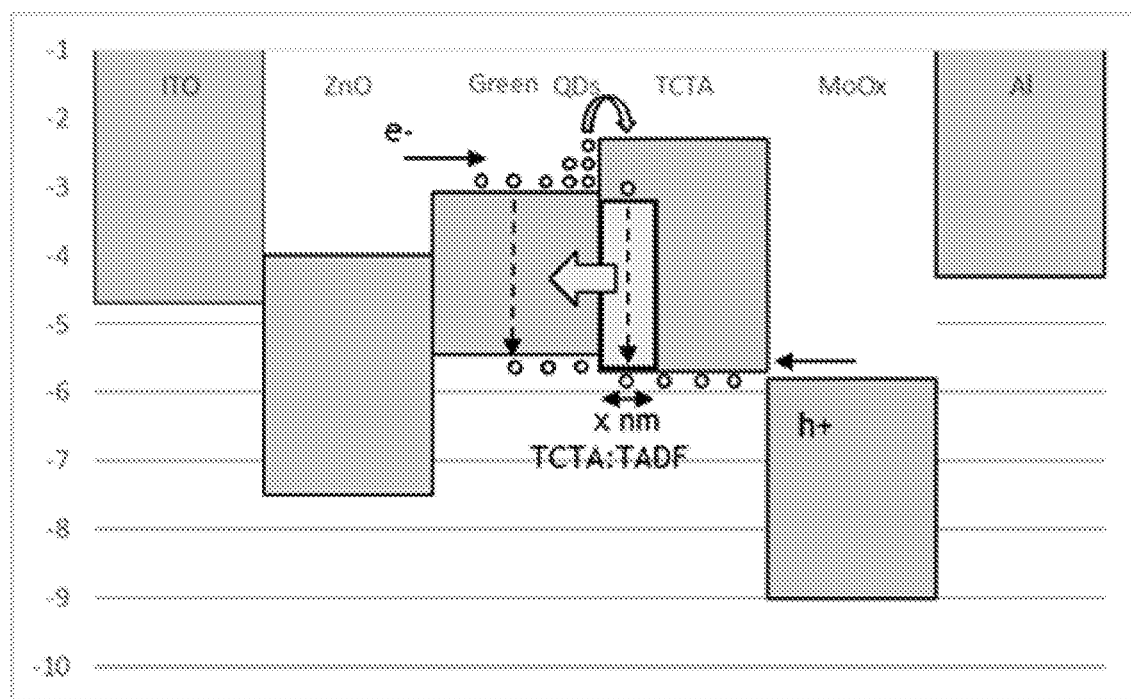
FIG. 6 is an energy level diagram of an exemplary electroluminescent QD-LED device constructed in accordance with various aspects of the present disclosure.

For example, the overlap along with the values used to estimate the critical distance for a system having a QD, exhibiting a maximum photoluminescence ($PL_{max}$) of 528 nm and a full-width at half maximum (FWHM) of 39 nm, and a TADF molecule, exhibiting a $PL_{max}$ of 548 nm and a FWHM of 92 nm, are presented in FIGS. 4-5 and Table 1. With specific reference to FIG. 5, this graph shows the spectral overlap integrand for these two materials. Maximizing this overlap is an important parameter which, as shown in Equation 1 above, will lead to an increased critical distance for FRET and so an increasing efficiency of energy transfer.

TABLE 1

| Parameter | Value |
| --- | --- |
| QD Extinction Coefficient at $\lambda_{max}$ | $2.2 \times 10^5$ $M^{-1}$ $cm^{-1}$ |
| Dipole orientation factor, $\kappa^2$ | 2/3 |
| Refractive index | 1.7 |
| QY donor (TADF molecule) | 0.52 |
| Critical distance, $R_0$ | 4.7 nm |

From the above, a critical distance of 4.7 nm is obtained for a QD, exhibiting a maximum photoluminescence ($PL_{max}$) of 528 nm and a full-width at half maximum (FWHM) of 39 nm, and a TADF molecule, exhibiting a $PL_{max}$ of 548 nm and a FWHM of 92 nm. One of ordinary skill in the art will readily understand the critical distance is a function of the particular QD and TADF molecule used in a system.

Maximization of QD Oscillator Strength

The oscillator strength of the band gap transition of a QD, $f_{gap}$, describes the probability of fluorescence. Thus, for two-dopant system applications it may be desirable to incorporate QDs having a high oscillator strength. In the strong quantum confinement regime, oscillator strength varies only weakly of with QD size, since the electron and hole wave functions overlap completely, independently of particle size, [M. D. Leistikow, J. Johansen, A. J. Kettelarij, P. Lodahl and W. L. Vos, *Phys. Rev. B*, 2009, 79, 045301] whereas for QDs beyond the strong quantum confinement regime the oscillator strength should increase with increasing particle size. [K. E. Gong, Y. Zeng and D. F. Kelley, *J. Phys. Chem. C*, 2013, 117, 20268].

QDs comprising a core comprising, for example, InP and emitting within the visible spectrum would have a radius well within the strong confinement regime and the oscillator strength would therefore largely be independent of particle size. In some instances, the shape of the QD may influence oscillator strength. In some instances, the QDs may be substantially spherical or ovoid. In other instances, the QDs may be substantially conical. In yet other instances, the QDs may be substantially cylindrical. In yet other instances, the QDs may be substantially rod-shaped. In yet other instances, the QDs may be in the form or nanorods, nanotubes, nanofibers, nanosheets, dendrimers, stars, tetrapods, disks, or similar physical configurations.

Increasing QD Absorption

A high QD absorption cross-section is desirable to maximise the FRET process. In quantum rods, for example the emission wavelength is controlled by the length of the short axis, and the absorption cross-section depends predominantly on volume. The absorption cross-section of a nanoparticle, $\alpha_a$, is defined in Equation 2:

$$\alpha_a(\hbar\omega) = \frac{n_b}{n}\alpha_b(\hbar\omega)|f(\hbar\omega)|^2 V$$

where $n_b$ and $\alpha_b$ are the refractive index and the absorption coefficient of the bulk semiconductor, respectively, n is the refractive index of the surrounding medium, $|f(\hbar\omega)|^2$ is the local-field factor, and V is the volume. Htoon et al. investigated the absorption cross-section of spherical (radius=2.3 nm) QDs compared with that of elongated nanoparticles, quantum rods, with the same radius but lengths of 22, 36 and 44 nm. [H. Htoon, J. A. Hollingworth, A. V. Malko, R. Dickerson and V. I. Klimov, Appl. Phys. Lett., 2003, 82, 4776]. As well as the nanorods having a larger volume, $|f(\hbar\omega)|^2$ was found to almost twice as high for randomly oriented nanorods compared to the spherical nanoparticles. $|f(\hbar\omega)|^2$ may be increased yet further for aligned nanorods. Thus, a quantum rod architecture may be advantageous over a spherical QD geometry, in terms of increasing the QD absorption cross-section.

Minimizing Excited State Lifetime

For efficient FRET, it is advantageous to minimize the excited state lifetime of QDs. Fundamentally, the excited state lifetime of a QD relates to the degree of confinement. The higher the overlap between the electron and hole, the stronger the confinement and the shorter the radiative lifetime. QD architectures that maximise the electron-hole overlap may be beneficial for two-dopant systems in electroluminescent devices. In some instances, for a given core size, increasing the shell thickness on said core decreases the excited state lifetime of the QD. However, as previously discussed, a core-shell quantum dot having a relatively thick shell may not be desirable, the distance between the TADF molecule and the QD increases with increasing shell thickness. Thus, alternative methods to manipulate the degree of confinement in the QD may be required.

In a Type I core-shell QD, an abrupt offset of the energy levels may result in strong confinement, whereas compositional grading may lead to some delocalisation of the electrons and holes. For example, the confinement in an InP/ZnS QD, consisting of an InP core (bulk band gap, $E_g$=1.34 eV) overcoated with a ZnS shell ($E_g$=3.54 eV (cubic); 3.91 eV (hexagonal)), will be stronger than that in an InP/ZnSe core-shell QD (ZnSe $E_g$=2.82 eV). An example of a compositionally graded Type I QD would be $In_{1-x}P_{1-y}Zn_xS_y$, wherein x and y increase gradually from 0, at the center of the QD, to 1, at the outer surface of the QD.

Where core-multishell architectures are used, the relative thicknesses of the shells may influence the degree of confinement.

For core QDs of a particular material, the smaller the QD, the higher the overlap between the electron and hole and thus the shorter the radiative lifetime. Therefore, strategies to reduce the diameter of the QD core while maintaining a specific emission wavelength may be employed. This could include alloying a first semiconductor material with a second material having a smaller band gap at a similar lattice constant. For example, an InAsP nanoparticle, made by alloying InP with InAs, may emit at 630 nm and will have a smaller diameter than an InP nanoparticle emitting at the same wavelength. Also, for example, a CdSeS nanoparticle, made by alloying CdS with CdSe, may emit at 480 nm and will have a smaller diameter than a CdS nanoparticle emitting at the same wavelength.

In some instances, nanoparticle shape may affect the excited state lifetime. For example, the radiative lifetime of prolate CdSe QDs may be slightly shorter than that of spherical CdSe nanoparticles. [K. Gong, Y. Zang and D. F. Kelley, J. Phys. Chem. C, 2013, 117, 20268] Thus, rod-shaped QDs, quantum rods, may offer a shorter excited state lifetime than spherical QDs. Herein, "quantum rod" is used to describe a quantum dot having lateral dimensions, x and y, and a length, z, wherein z>x,y. Alternatively, a shorter excited state lifetime may be provided by a 2-dimensional QD, wherein the quantum dot has lateral dimensions in the quantum confinement regime and a thickness between 1-5 monolayers.

In one particular exemplary embodiment, an emissive layer of a top-emitting (TE) printed display comprises nanocrystal QDs in association with thermally activated delayed fluorescent (TADF) molecules in a host material and electron and hole charge transport materials, wherein the QDs and TADF molecules in the host material, and the electron and hole charge transport materials are sandwiched into a microcavity between a reflective bottom electrode and a transparent or semi-transparent top electrode.

Optical cavities are devices wherein the resonance condition for a particular wavelength of light is satisfied. Light is reflected at the two ends of the cavity and interference between the reflected light waves causes certain wavelengths to be suppressed in the cavity by destructive interference while others are enhanced by constructive interference. The production of such standing modes in the cavity results in the light coupled out of the cavity being narrowed in wavelength and increased in intensity due to the feedback effect—only those wavelengths that are resonant with the cavity being allowed to persist.

A "strong cavity" is one wherein the above-described cavity effect is relatively large—the extreme case being a laser wherein the emission is effectively narrowed to a single wavelength and the light is very intense and highly directional. A "weak cavity" is one exhibiting only a slight cavity effect wherein the emission narrowing and intensity enhancement are relatively small.

A number of advantages in using the TADF+QD emitter combination for microcavities may be realized using the design of the present invention:

Because peaks in the emission spectra of QDs are significantly narrower than those of organic materials, the interference enhancement may be stronger as a greater proportion of the emission will satisfy the resonant condition of the cavity.
  The color shift with angle may also be reduced as a result of the reduced full width at half maximum (FWHM) of the peak(s) in the emission spectrum of the quantum dots.
  Thin and uniform QD films have been demonstrated using a variety of scalable, solution processing techniques, such as spin coating, doctor blading, drop casting and slit coating, as well as methods of printing such as inkjet printing and transfer printing wherein thickness may be controlled to the nanometer level.

Figure 7:
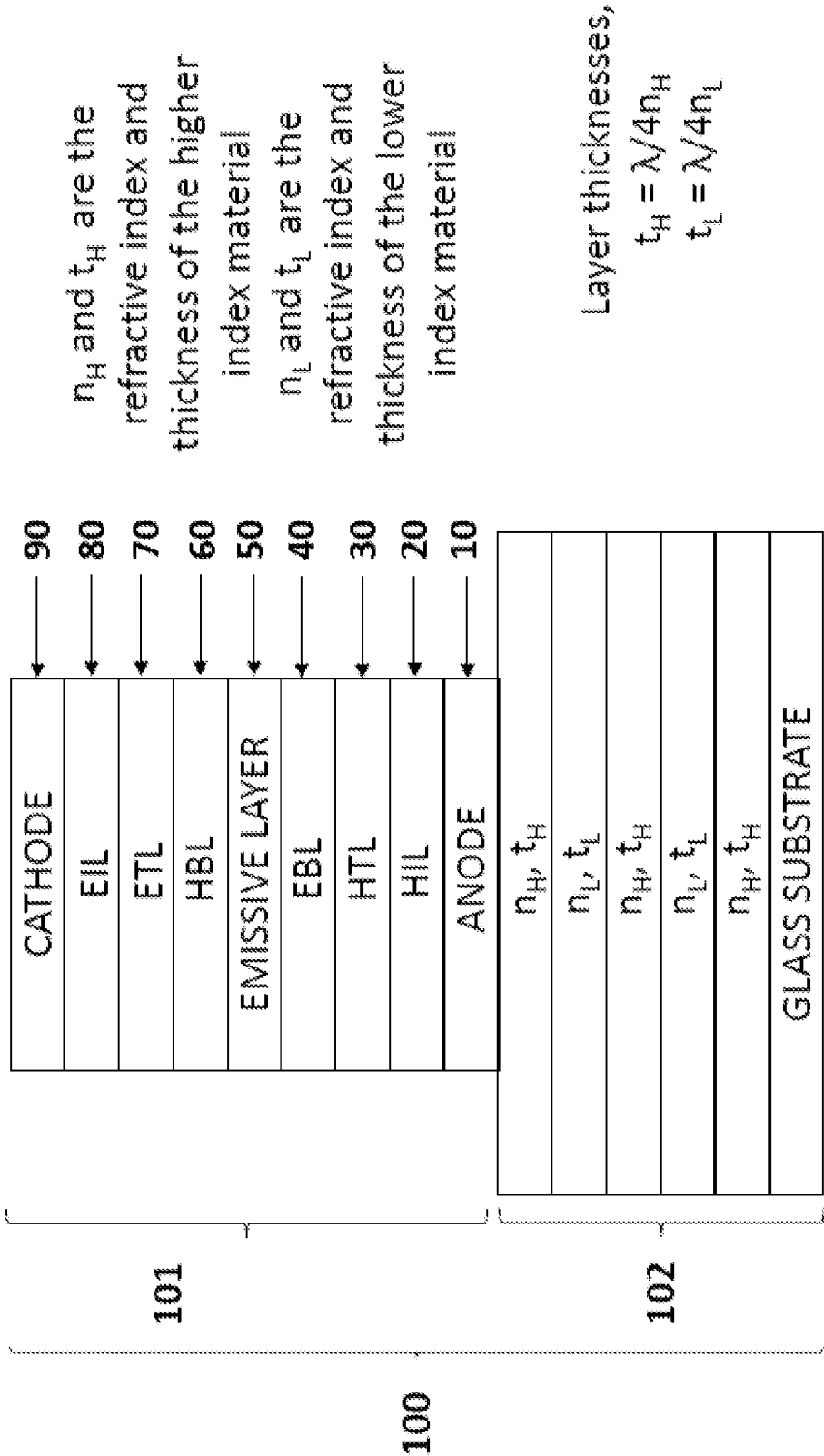
FIG. 7 is a schematic drawing of a device according to a first embodiment of the invention.

Two ways that micro cavities may be implemented are either through lossless dielectric mirrors or through the use of metal mirrors. In the former, the substrate may become a distributed Bragg reflector (DBR)—an optical structure made up of alternating layers having differing refractive indices—e.g. $TiO_2$ (n=2.45) and $SiO_2$ (n=1.5). The refractive index alternates in the layers between high and low with the layer thickness tuned to give high reflection at a specific wavelength. A device of this type is illustrated in FIG. 7 wherein top emitting display device 100 comprises emissive element 101 in optical communication with distributed Bragg reflector 102. Emissive element 101 comprises anode 10, hole injection layer (HIL) 20, hole transport layer (HTL) 30, electron blocking layer (EBL) 40, emissive layer 50 (which may comprise quantum dots and TADF molecules), hole blocking layer (HBL) 60, electron transport layer (ETL) 70, electron injection layer (EIL) 80 and cathode 90.

Figure 8:
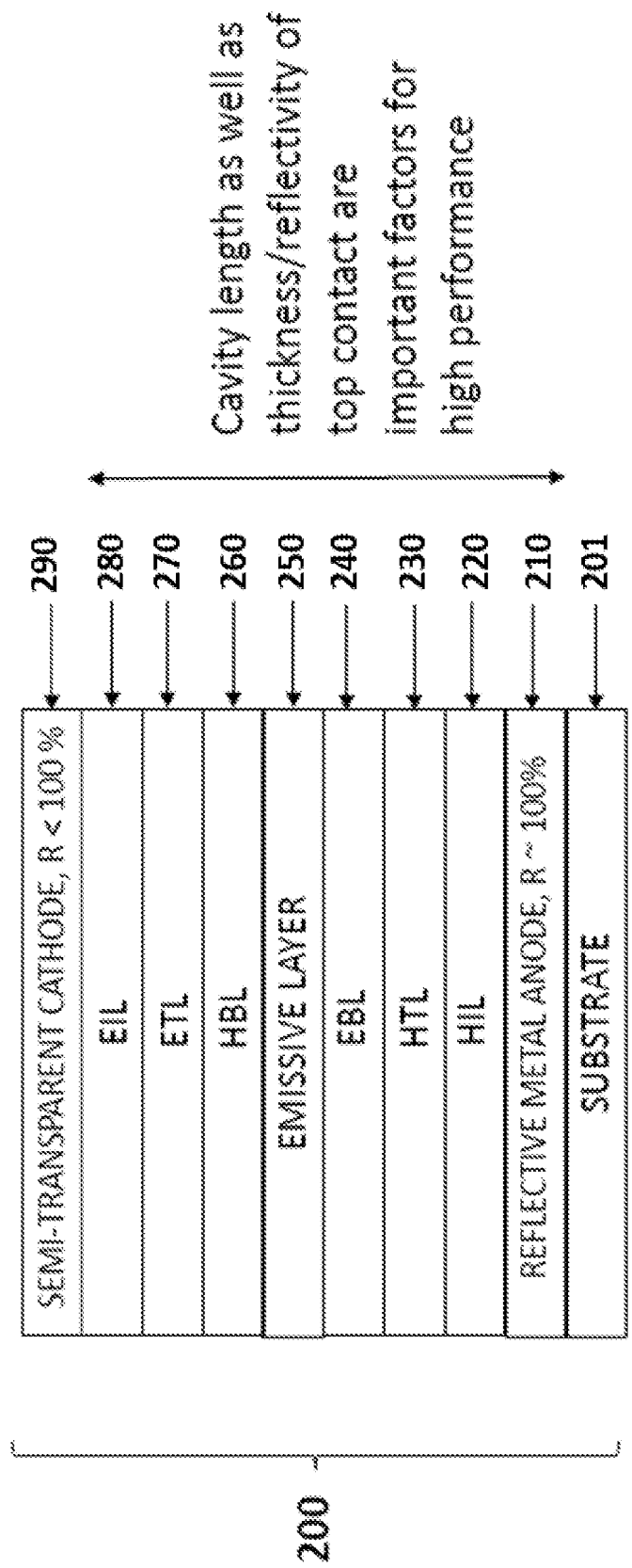
FIG. 8 is a schematic drawing of a device according to a second embodiment of the invention.

In the latter of the above-recited two ways that micro cavities may be implemented, the bottom electrode may be a highly reflective metal mirror (Ag, Al) and the top electrode may be semi-transparent—e.g. thin metal or a transparent conductive oxide (TCO). Of the two ways that micro cavities may be implemented, this is the easier approach as it requires only the relatively simple deposition of metal mirrors. A device 200 of this type is illustrated schematically in FIG. 8.

The following examples show the performance enhancements that may obtain when an emissive device employs a combination of quantum dots and TADF molecules.

Example 1

An electroluminescent QD-LED device was constructed by spin-coating a 60-nm layer of ZnO nanoparticles onto an indium tin oxide (ITO) substrate which served as the cathode of the QD-LED. The ZnO nanoparticle layer served as both the EIL and ETL. Next, a solution of green-emitting CFQD® quantum dots [Nanoco Technologies Limited, Manchester, UK] comprising indium and phosphorus ($PL_{max}$=528 nm, FWHM=39 nm) in toluene was spin-coated onto the ZnO nanoparticle layer and heated to evaporate the toluene to form a ~15-nm QD emissive layer. Next, an HTL, having a thickness of 40 nm, made of 4,4',4''-tris(N-carbazolyl)triphenyl-amine (TCTA) was formed on the emissive layer via thermal evaporation. Then, an HIL having a thickness of about 10 nm, made of molybdenum oxide was formed on the HTL via thermal evaporation. Finally, an aluminum cathode layer having a thickness of about 100 nm, was formed on the HIL via thermal evaporation.

Example 2

An electroluminescent QD-LED was prepared in the same way as that of Example 1 except a TADF molecule (TADF-1; shown below; $PL_{max}$=548 nm, FWHM=92 nm) was doped into the first 3 nm of the HTL adjacent to the emissive layer at a doping concentration of about 20 wt. %. Thus, the first 3 nm of TCTA adjacent to the emissive layer had approximately 20 wt. %. TADF while the remaining 37 nm not adjacent to the emissive layer was pure TCTA.

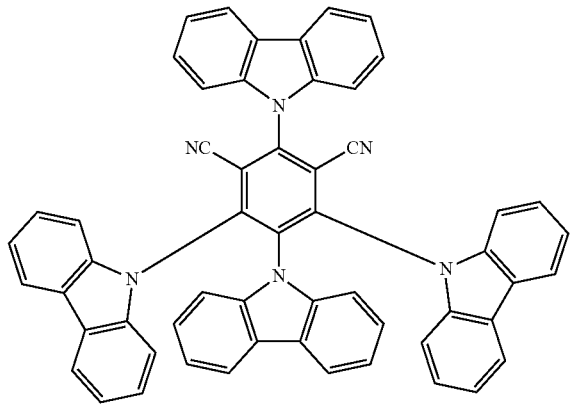

TADF-1

Example 3

An electroluminescent QD-LED was prepared in the same way as that of Example 2 except the TADF-1 molecule was doped into the first 5 nm of the HTL adjacent to the emissive layer at a doping concentration of about 20 wt. %. Thus, the first 5 nm of TCTA adjacent to the emissive layer had approximately 20 wt. %. TADF while the remaining 35 nm not adjacent to the emissive layer was pure TCTA.

Example 4

An electroluminescent QD-LED was prepared in the same way as that of Example 2 except the TADF-1 molecule was doped into the first 7 nm of the HTL adjacent to the emissive layer at a doping concentration of about 20 wt. %. Thus, the first 7 nm of TCTA adjacent to the emissive layer had approximately 20 wt. % TADF while the remaining 33 nm not adjacent to the emissive layer was pure TCTA.

Example 5

An electroluminescent QD-LED was prepared in the same way as that of Example 2 except the TADF-1 molecule was doped into the first 9 nm of the HTL adjacent to the emissive layer at a doping concentration of about 20 wt. %. Therefore the first 9 nm of TCTA adjacent to the emissive layer had approximately 20 wt. %. TADF while the remaining 31 nm not adjacent to the emissive layer was pure TCTA.

Comparative Performance Data for Examples 1-5

Figure 9:
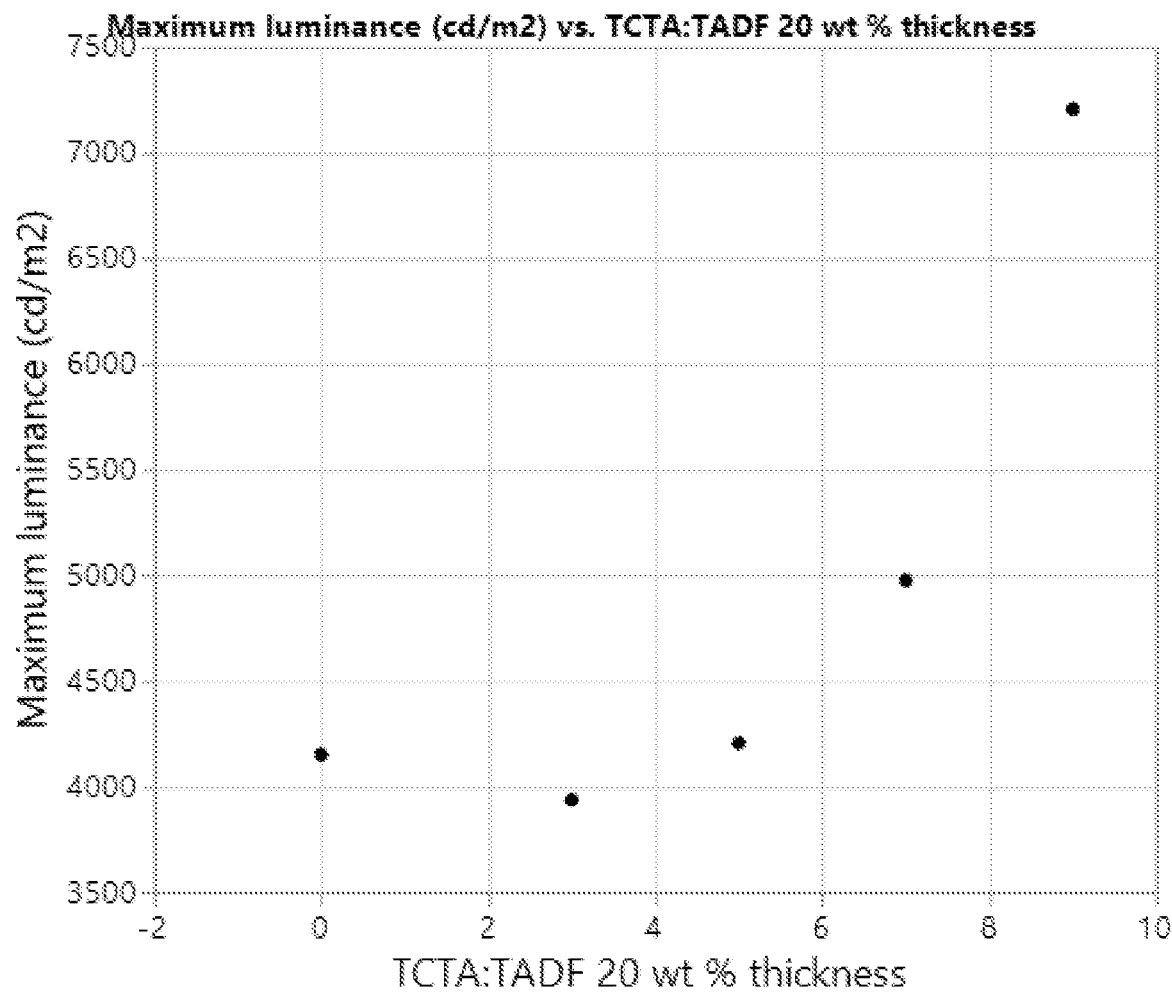
FIG. 9 is a graph showing maximum luminance (cd/m$^2$) values exhibited by variations of a QD-LED device as per Examples 1-5 of this disclosure.

FIG. 9 shows the maximum luminance ($cd/m^2$) values exhibited by the QD-LED devices of Examples 1-5. As shown, the QD-LED device which contained no TADF (Example 1) exhibited a maximum luminance of about 4200 $cd/m^2$. While the QD-LED devices of Examples 2-3 exhibited a lower or roughly equivalent maximum luminance as a QD-LED device with no TADF, a marked luminance enhancement is observed for the two thickest TADF-doped layers of 7 and 9 nm (Examples 4 and 5). This enhancement is about 125% for the 7-nm TADF-doped layer (Example 4) and about 170% for the 9-nm TADF-doped layer (Example 5) QD-LED devices at maximum brightness. This enhancement could be explained by overflow electrons being captured by the TADF recombining with holes and the subsequent energy transfer from TADF to QDs. This is notable in that the largest enhancement comes from a TADF-doped layer thickness that is considerably thicker than the calculated critical distance (4.7 nm) beyond which the energy transfer efficiency is expected to decrease.

Figure 10:
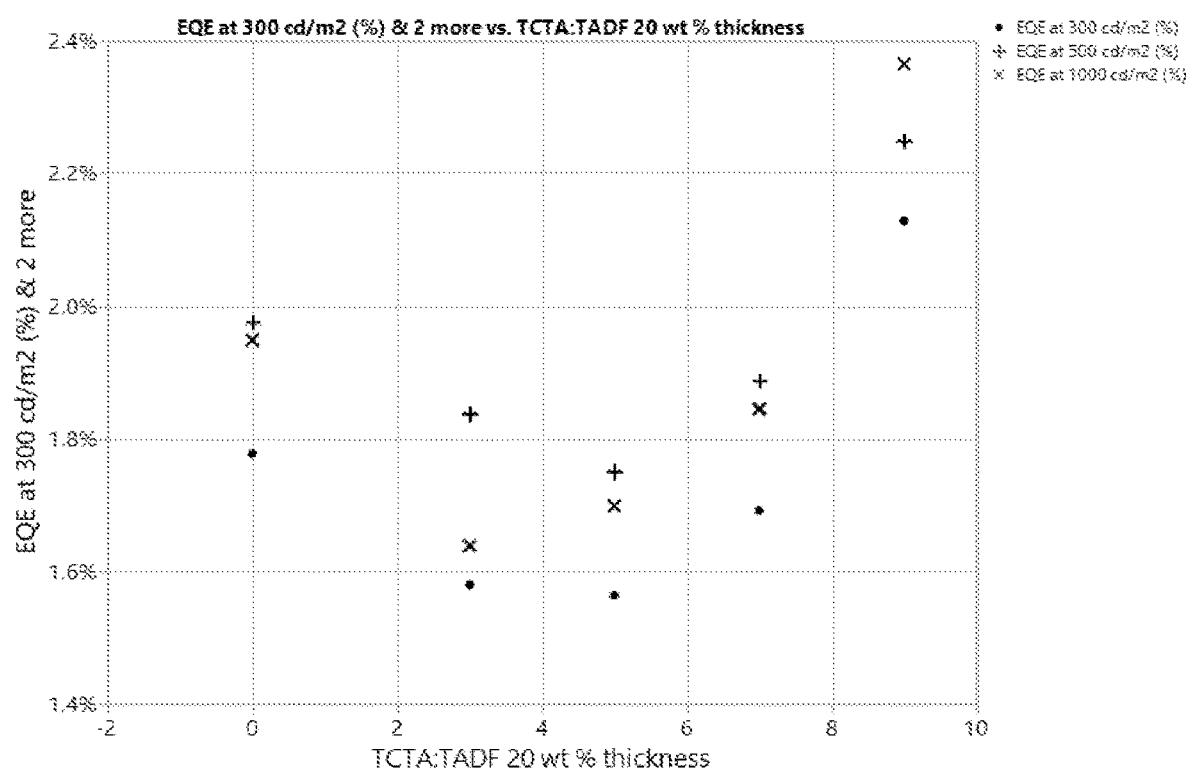
FIG. 10 is a graph showing external quantum efficiencies (EQEs) exhibited by variations of a QD-LED as per Examples 1-5 of this disclosure.

FIG. 10 shows the external quantum efficiencies (EQEs) exhibited by the QD-LED devices of Examples 1-5. Significant enhancement of the EQE and current efficiency was only observed in the 9-nm TADF-doped layer (Example 5) QD-LED device. Without being bound to any particular theory, it is contemplated that the reason for this may be due to exciplex formation between the TADF molecule and the TCTA which is not the desirable transfer mechanism.

Figure 11:
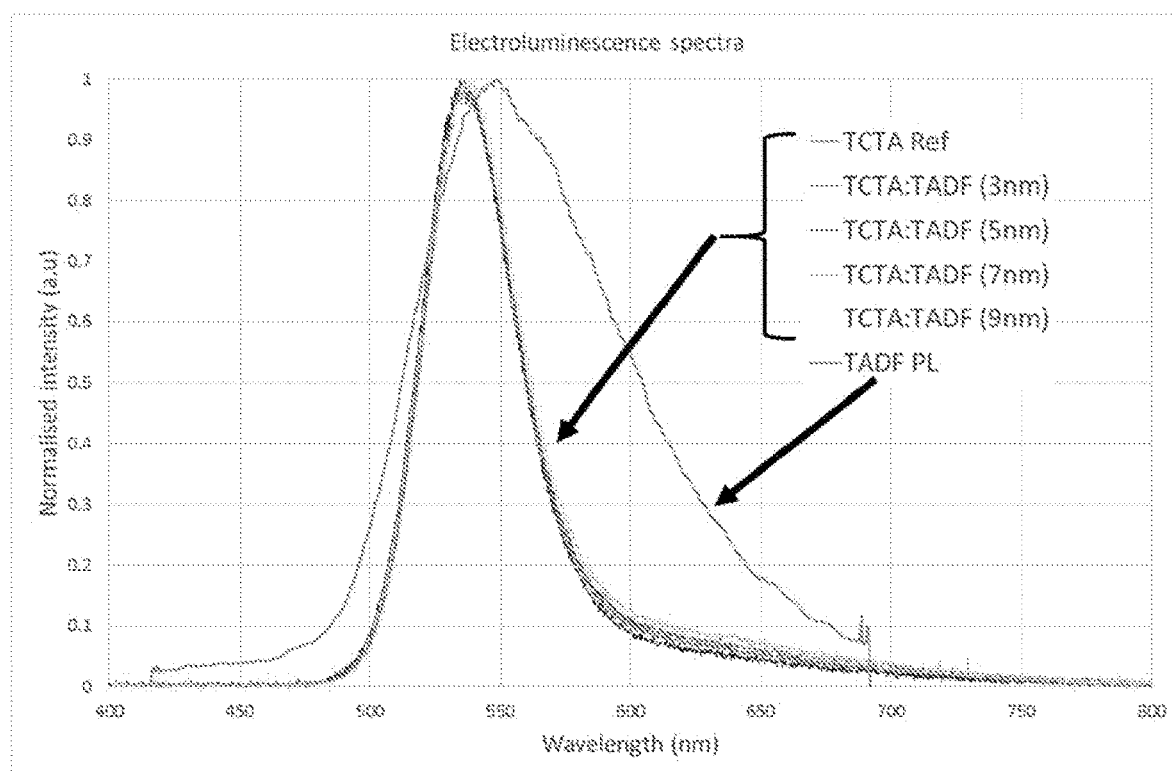
FIG. 11 is a graph showing emission spectra of the QD-LED devices as per Examples 1-5 of this disclosure.

FIG. 11 contains emission spectra of the QD-LED devices of Examples 1-5; "TCTA Ref" corresponds to Example 1 and "TADF PL" corresponds to pure TADF molecule. As can be seen, the pure TADF molecule exhibits a $PL_{max}$=548 nm and a FWHM=92 nm. In all examples, other than pure TADF molecule, where green-emitting CFQD® quantum dots are present, the QD-LED devices exhibit a $PL_{max}$=538 nm and a FWHM=42 nm. It is therefore clear that the triplet excitons are being harvested by the TADF molecule and transferred to the QDs for delayed fluorescence and such delayed fluorescence originates from the QD-containing emissive layer.

Example 6

In this example, an emissive film comprising TADF molecules and QDs was prepared. A solution of green-emitting CFQD® quantum dots [Nanoco Technologies Limited, Manchester, UK] comprising indium and phosphorus ($PL_{max}$=527 nm, FWHM=40 nm) in toluene was prepared at a concentration of 2 mg/mL. A solution of sky blue-emitting TADF molecules (TADF-2, shown below; $PL_{max}$=486 nm, FWHM=81 nm when deposited as a film) in toluene was prepared at a concentration of 10 mg/mL.

TADF-2

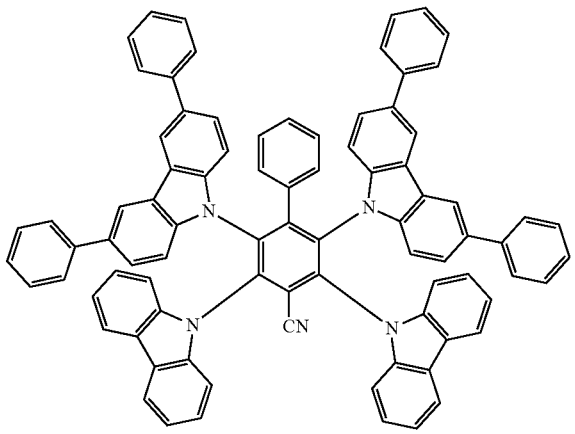

0.25 mL of the TADF solution and 5 mL of the QD solution were combined and spin-coated onto a quartz glass substrate at 2000 rpm for 60 seconds to form a 20-nm film.

Figure 12:
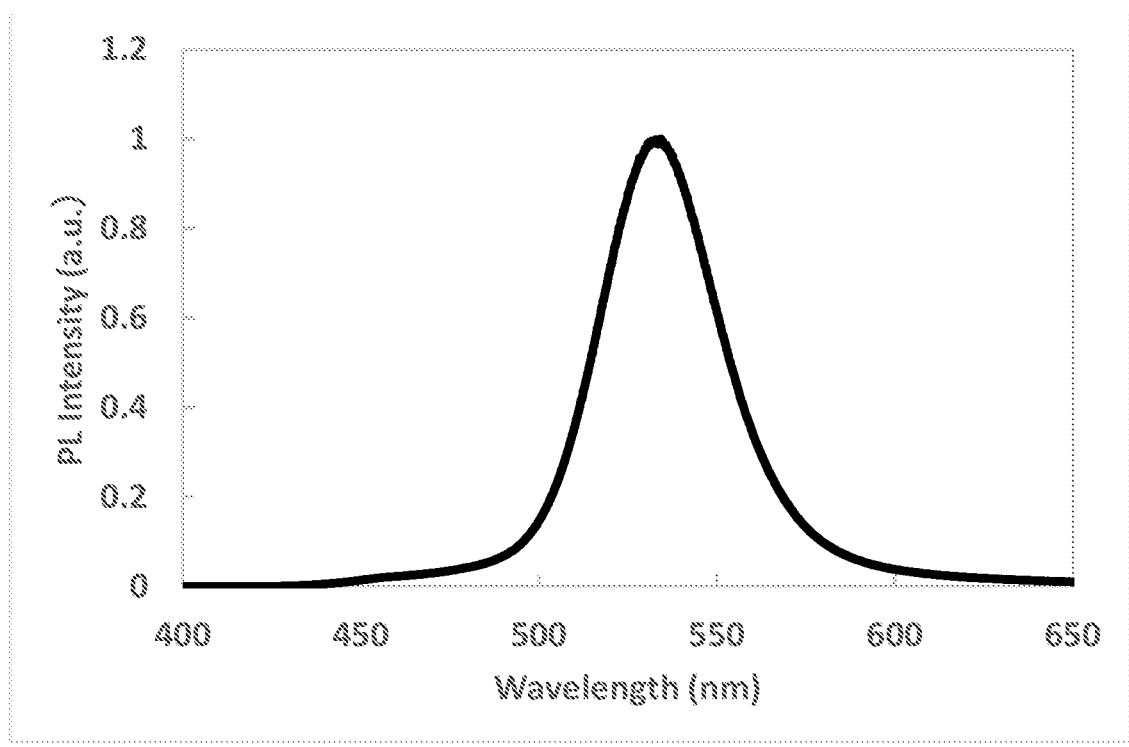
FIG. 12 is a graph showing the photoluminescence spectrum of an emissive film comprising TADF molecules and QDs.
Figure 13:
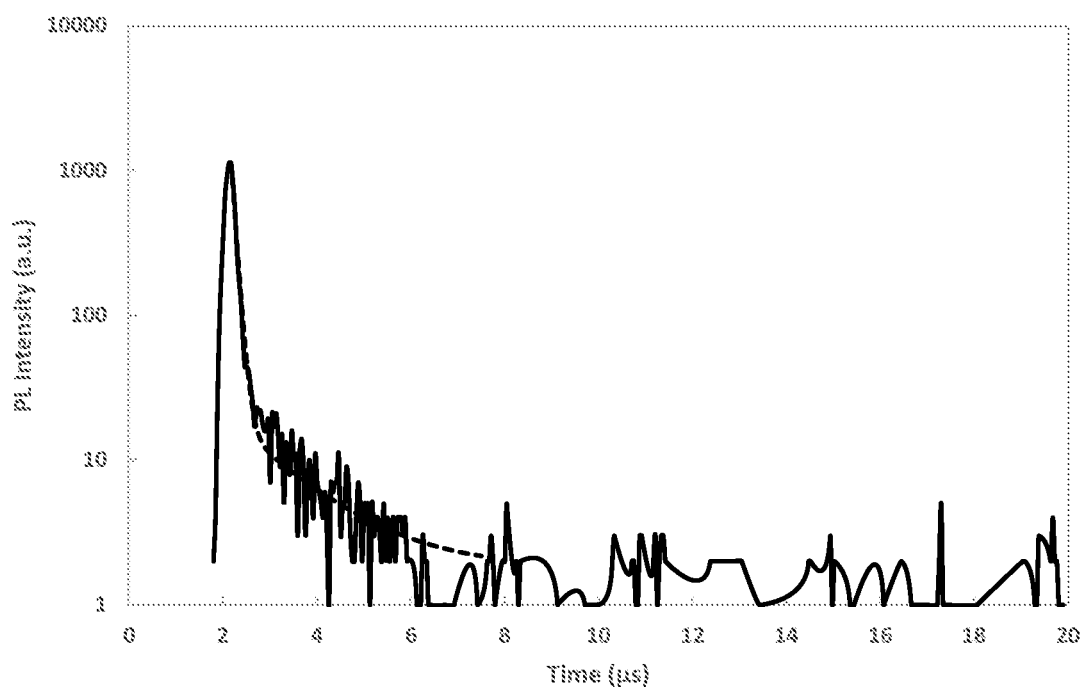
FIG. 13 is a graph showing photoluminescence intensity versus time of the emissive film whose PL spectrum is shown in FIG. 12.

The PL spectrum and transient PL characteristics were measured. As illustrated in FIG. 12, the PL spectrum exhibited a single emission peak ($PL_{max}$~535 nm, FWHM~39 nm), indicative of energy transfer from the TADF molecules to the QDs. FIG. 13 shows the PL intensity versus time. The transient PL characteristics were used to calculate a transient lifetime, with a prompt component, $\tau_1$=0.124 μs and a delayed component, $\tau_2$=1.356 μs. For comparison, the transient lifetime of a QD-only film at the same concentration was $\tau_1$=0.02 μs and $\tau_2$=0.14 μs. The longer lifetime of the delayed component from the combined TADF-QD film compared to the QD-only film may be further indicative of energy transfer from the TADF molecules to the QDs. Overall, the results demonstrate the compatibility of TADF molecules and QDs in a combined film, resulting in an energy transfer process from the TADF molecules to the QDs. Although the films prepared were not used to make emissive devices, this process (i.e. spin coating a solution containing QDs and TADF molecules in a compatible solvent) may be applicable to the preparation of top-emitting displays of the type described hereinabove.

The foregoing presents particular embodiments of a system embodying the principles of the invention. Those skilled in the art will be able to devise alternatives and variations which, even if not explicitly disclosed herein, embody those principles and are thus within the scope of the invention. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. An emissive layer of a top-emitting (TE) printed display comprising:
 nanocrystal quantum dots (QDs) and thermally activated delayed fluorescent (TADF) molecules; and
 electron and hole charge transport materials,
 wherein at least one of the QDs and the TADF molecules are disposed in a host material which is 4,4',4"-tris(N-carbazolyl)triphenyl-amine (TCTA).

2. The emissive layer of claim 1, wherein the emissive layer has a thickness ranging from about 5 nm to about 100 nm.

3. The emissive layer of claim 1, wherein the QDs and TADF molecules are present in a QD:TADF ratio ranging from about 10:1 to about 1:10 by weight.

4. The emissive layer of claim 1, wherein the QDs are blue-emitting QDs, red-emitting QDs, green-emitting QDs, or any combination thereof.

5. The emissive layer of claim 1, wherein the QDs are UV-emitting QDs or IR-emitting QDs.

6. The emissive layer of claim 1, wherein the QDs are selected from the group consisting of core QDs, core-shell QDs, core-multishell QDs, and quantum dot-quantum well (QD-QW) QDs.

7. The emissive layer of claim 1, wherein the QDs comprise In and P.

8. The emissive layer of claim 1, wherein the QDs further comprise capping ligands.

9. The emissive layer of claim 1, wherein the TADF molecules are selected from the group consisting of (2,3,5,6-tetra(9H-carbazol-9-yl)isonicotinonitrile, 2,3,5,6-tetra(9H-carbazol-9-yl)benzonitrile, 2,3,4,5,6-penta(9H-carbazol-9-yl)benzonitrile, 2,3,5,6-tetrakis(3,6-di-tert-butyl-9H-carbazol-9-yl)benzonitrile, 2,3,4,5,6-pentakis(3,6-di-tert-butyl-9H-carbazol-9-yl)benzonitrile, 4,5-di(9H-carbazol-9-yl)phthalonitrile, 3,4,5,6-tetra(9H-carbazol-9-yl)phthalonitrile, 4,4"-bis(9,9-dimethylacridin-10(9H)-yl)-[1,1':2',1"-terphenyl]-4',5'-dicarbonitrile, 2,4,5,6-tetra(9H-carbazol-9-yl)isophthalonitrile, 2,4,5,6-tetrakis(3,6-dimethyl-9H-carbazol-9-yl)isophthalonitrile, 6-di(9H-carbazol-9-yl)-4-phenylpyridine-3,5-dicarbonitrile, 2,3,5,6- tetra(9H-carbazol-9-yl)terephthalonitrile, 2,3,5,6-tetrakis(3,6-diphenyl-9H-carbazol-9-yl)terephthalonitrile, 12-(4,6-diphenyl-1,3,5-triazin-2-yl)-5-phenyl-5,12-dihydroindolo[3,2-a]carbazole, 9-(4,6-diphenyl-1,3,5-triazin-2-yl)-9'-phenyl-9H,9'H-3,3'-bicarbazole, 9-(4-(4,6-diphenyl-1,3,5-triazin-2-yl)phenyl)-9'-phenyl-9H,9'H-3,3'-bicarbazole, 9-(4-(4,6-diphenyl-1,3,5-triazin-2-yl)phenyl)-9H-3,9'-bicarbazole, 9'-(4-(4,6-diphenyl-1,3,5-triazin-2-yl)phenyl)-9'H-9,3':6',9''-tercarbazole, 9'-(4-(4,6-diphenyl-1,3,5-triazin-2-yl)phenyl)-3,3'',6,6''-tetraphenyl-9'H-9,3':6',9''-tercarbazole, 10-(4-(4,6-diphenyl-1,3,5-triazin-2-yl)phenyl)-10H-phenoxazine, 10-(4-(4,6-diphenyl-1,3,5-triazin-2-yl)phenyl)-10H-phenothiazine, 9-(4-(4,6-diphenyl-1,3,5-triazin-2-yl)phenyl)-1,3,6,8-tetramethyl-9H-carbazole, 9-(4-(4,6-diphenyl-1,3,5-triazin-2-yl)-2,6-dimethylphenyl)-3,6-dimethyl-9H-carbazole, 10-(4-(4,6-diphenyl-1,3,5-triazin-2-yl)phenyl)-9,9-dimethyl-9,10-dihydroacridine, 10-(4-(4,6-diphenyl-1,3,5-triazin-2-yl)phenyl)-10H-spiro[acridine-9,9'-fluorene], 9-(4-(4,6-diphenyl-1,3,5-triazin-2-yl)phenyl)-N3,N3,N6,N6-tetraphenyl-9H-carbazole-3,6-diamine, 10-(4-(2-(4-(4,6-diphenyl-1,3,5-triazin-2-yl)phenyl)-1,1,1,3,3,3-hexafluoropropan-2-yl)phenyl)-9,9-dimethyl-9,10-dihydroacridine, 10,10'-((6-phenyl-1,3,5-triazine-2,4-diyl)bis(4,1-phenylene))bis(10H-phenoxazine), 2,4,6-tris(4-(9,9-dimethylacridin-10(9H)-yl)phenyl)-1,3,5-triazine, 2,4,6-tris(4-(10H-phenoxazin-10-yl)phenyl)-1,3,5-triazine, 9,9',9''-(5-(4,6-diphenyl-1,3,5-triazin-2-yl)benzene-1,2,3-triyl)tris(9H-carbazole), 9,9',9''-(5-(4,6-diphenyl-1,3,5-triazin-2-yl)benzene-1,2,3-triyl)tris(3,6-dimethyl-9H-carbazole), 10-(4-(benzo[d]oxazol-2-yl)phenyl)-10H-phenoxazine, 2,6-bis(4-(10H-phenoxazin-10-yl)phenyl)benzo[1,2-d:5,4-d']bis(oxazole), 2,6-bis(diphenylamino)anthracene-9,10-dione, 2,6-bis(4-(bis(4-(tert-butyl)phenyl)amino)phenyl)anthracene-9,10-dione, 3-(9,9-dimethylacridin-10(9H)-yl)-9H-xanthen-9-one, 3-(9'H-[9,3':6',9''-tercarbazol]-9'-yl)-9H-xanthen-9-one, 5,9-diphenyl-5,9-dihydro-5,9-diaza-13b-boranaphtho[3,2,1-de]anthracene, 9-([1,1'-biphenyl]-3-yl)-N,N,5,11-tetraphenyl-5,9-dihydro-5,9-diaza-13b-boranaphtho[3,2,1-de]anthracen-3-amine, 9,9-dimethyl-10-(10-(2,4,6-triisopropylphenyl)-10H-dibenzo[b,e][1,4]oxaborinin-3-yl)-9,10-dihydroacridine, 9-(4-(dimesitylboraneyl)-3,5-dimethylphenyl)-N3,N3,N6,N6-tetraphenyl-9H-carbazole-3,6-diamine, 4,4',4''-(1,3,3a1,4,6,7,9-heptaazaphenalene-2,5,8-triyl)tris(N,N-bis(4-(tert-butyl)phenyl)aniline), 7,10-bis(4-diphenylamino)phenyl) dibenzo[f,h]quinoxaline-2,3-dicarbonitrile), 12,12'-(6-([1,1'-biphenyl]-4-yl)-1,3,5-triazine-2,4-diyl)bis(11-phenyl-11,12-dihydroindolo[2,3-a]carbazole), bis(4-(9H-[3,9'-bicarbazol]-9-yl)phenyl)methanone, 10,10'-(sulfonylbis(4,1-phenylene))bis(9,9-dimethyl-9,10-dihydroacridine), 10-phenyl-10H,10'H-spiro[acridine-9,9'-anthracen]-10'-one, any analog thereof, and any homolog thereof.

10. The emissive layer of claim 1, wherein the TADF molecules are selected from the group consisting of

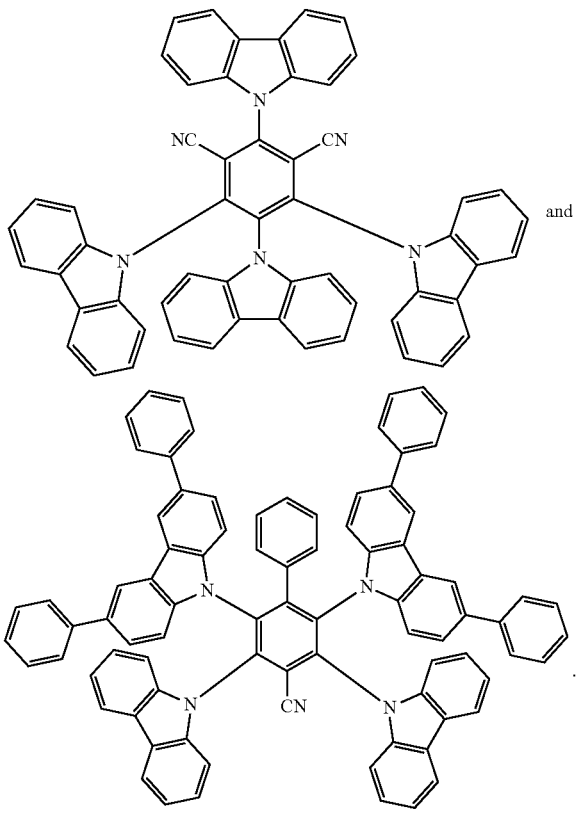

and

* * * * *